US012401006B2

(12) United States Patent
Staffaroni et al.

(10) Patent No.: US 12,401,006 B2
(45) Date of Patent: Aug. 26, 2025

(54) ELECTRICAL INTERCONNECTS FOR PACKAGES CONTAINING PHOTONIC INTEGRATED CIRCUITS

(71) Applicant: Celestial AI Inc., Santa Clara, CA (US)

(72) Inventors: Matteo Staffaroni, San Ramon, CA (US); Kevin Park, Santa Clara, CA (US); Saurabh Vats, Palo Alto, CA (US); Subal Sahni, La Jolla, CA (US); Ismail Hakki Ozguc, Santa Clara, CA (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 18/751,021

(22) Filed: Jun. 21, 2024

(65) Prior Publication Data

US 2025/0219034 A1 Jul. 3, 2025

Related U.S. Application Data

(60) Provisional application No. 63/616,430, filed on Dec. 29, 2023.

(51) Int. Cl.
*H01L 25/16* (2023.01)
*G02B 6/12* (2006.01)
(Continued)

(52) U.S. Cl.
CPC .............. *H01L 25/167* (2013.01); *G02B 6/12* (2013.01); *G02F 1/0113* (2021.01);
(Continued)

(58) Field of Classification Search
CPC ............. H01L 25/0652; H01L 25/0655; H01L 25/0657; H01L 25/167; H01L 23/481;
(Continued)

(56) References Cited

U.S. PATENT DOCUMENTS 9,495,295 B1 * 11/2016 Dutt .................... G06F 9/44505
10,162,139 B1 * 12/2018 Wang ..................... G02B 6/122
(Continued)

FOREIGN PATENT DOCUMENTS

CN 111952255 A * 11/2020 ............... G02B 6/30
EP 4276505 A1 11/2023

OTHER PUBLICATIONS

Chou et al., "Demonstration of Fan-out Silicon Photonics Module for Next Generation Co-Packaged Optics (CPO) Application," 2022 IEEE 72nd Electronic Components and Technology Conference (ECTC), May 31, 2022, pp. 394-402.
(Continued)

*Primary Examiner* — Alonzo Chambliss
(74) *Attorney, Agent, or Firm* — Fish & Richardson P.C.

(57) ABSTRACT

A system-in-package includes: a photonic integrated circuit (PIC) including an active photonic component; and an electronic integrated circuit (EIC) stacked on the PIC, the EIC including: an electrical component electrically connected to a landing pad, and a copper pillar embedded in the landing pad and protruding from the landing pad that connects with the active photonic component such that the electrical component is electrically connected to the active photonic component. The landing pad has a larger surface area than a cross sectional area of the copper pillar, and wherein, when viewed from the EIC towards the PIC, the active photonic component on the PIC is offset from the landing pad of the EIC, wherein the offset is sufficient to keep a parasitic capacitance between the landing pad and the active photonic component within a pre-determined threshold level of tolerance.

34 Claims, 15 Drawing Sheets

(51) Int. Cl.
   *G02F 1/01*     (2006.01)
   *H01L 23/48*    (2006.01)
   *H01L 23/522*   (2006.01)
   *H01L 23/64*    (2006.01)
   *H01L 25/065*   (2023.01)
   *H04B 10/70*    (2013.01)

(52) U.S. Cl.
   CPC ........ *H01L 23/481* (2013.01); *H01L 23/5225* (2013.01); *H01L 23/642* (2013.01); *H01L 23/645* (2013.01); *H01L 25/0652* (2013.01); *H01L 25/0655* (2013.01); *H01L 25/0657* (2013.01); *H04B 10/70* (2013.01)

(58) Field of Classification Search
   CPC . H01L 23/5225; H01L 23/645; H01L 23/642; G02F 1/0113; G02B 6/12; G02B 23/481; G02B 23/5225; H04B 10/70
   See application file for complete search history.

(56)        References Cited

U.S. PATENT DOCUMENTS

| | | | |
|---|---|---|---|
| 10,989,887 | B2 | 4/2021 | Lim et al. |
| 11,107,770 | B1 | 8/2021 | Ramalingam et al. |
| 11,315,855 | B2 | 4/2022 | Chen et al. |
| 11,493,714 | B1 | 11/2022 | Mendoza et al. |
| 11,789,218 | B2 | 10/2023 | Shen et al. |
| 11,835,777 | B2 * | 12/2023 | Winterbottom ....... G02F 1/0157 |
| 12,189,198 | B1 * | 1/2025 | Aggarwal ............... H01L 25/50 |
| 12,216,318 | B2 | 2/2025 | Winterbottom et al. |
| 2009/0289360 | A1 * | 11/2009 | Takahashi ............... H05K 1/111 257/737 |
| 2014/0183693 | A1 * | 7/2014 | Tsai ........................ H01L 24/05 257/532 |
| 2019/0207687 | A1 | 7/2019 | Raj |
| 2019/0333905 | A1 * | 10/2019 | Raghunathan .... H01L 23/49838 |
| 2021/0223489 | A1 * | 7/2021 | Weng ...................... H01L 24/16 |
| 2021/0224454 | A1 | 7/2021 | Ramey et al. |
| 2022/0091332 | A1 | 3/2022 | Yoo et al. |
| 2022/0246502 | A1 | 8/2022 | Chen et al. |
| 2022/0390562 | A1 | 12/2022 | Bai et al. |
| 2022/0392881 | A1 | 12/2022 | Yu et al. |
| 2023/0194778 | A1 | 6/2023 | Kim et al. |
| 2023/0296838 | A1 | 9/2023 | Lazovsky et al. |
| 2023/0411369 | A1 | 12/2023 | Karhade et al. |
| 2023/0418010 | A1 | 12/2023 | Winterbottom et al. |
| 2024/0153934 | A1 * | 5/2024 | Aggarwal ................ G02B 6/43 |

OTHER PUBLICATIONS

International Search Report and Written Opinion in International Appln. No. PCT/US2024/062176, mailed on Apr. 25, 2025, 18 pages.

International Search Report and Written Opinion in International Appln. No. PCT/US2024/062179, mailed on Apr. 1, 2025, 18 pages.

Raj et al., "Design of a 50-GB/s Hybrid Integrated Si-Photonic Optical Link in 16-nm FinFET," IEEE Journal of Solid-state Circuits, Apr. 1, 2020, 55(4):1086-1095.

Ramon et al., "70 GB/s Low-Power DC-Coupled NRZ Differential Electro-Absorption Modulator Driver in 55 nm SiGe BiCMOS," Journal of Lightwave Technology, Mar. 1, 2019, 37(5):1504-1514.

* cited by examiner

ELECTRICAL INTERCONNECTS FOR PACKAGES CONTAINING PHOTONIC INTEGRATED CIRCUITS

PRIORITY CLAIM

This application claims priority to the U.S. Provisional Patent Application No. 63/616,430, filed Dec. 29, 2023, the entire contents of which are incorporated by reference herein.

BACKGROUND

Demands for artificial intelligence (AI) computing, such as machine learning (ML) and deep learning (DL), are increasing faster than they can be met by increases in available processing capacity. This rising demand and the growing complexity of AI models drive the need to connect many chips into a system where the chips can send data between each other with low latency and at high speed. Performance when processing a workload is limited by memory and interconnect bandwidth. In many conventional systems, data movement leads to significant power consumption, poor performance, and excessive latency. Thus, multi-node computing systems that can process and transmit data between nodes quickly and efficiently may be advantageous for the implementation of (ML) models.

SUMMARY

A photonic interconnect platform for memory and compute is disclosed that features hybrid electro-photonic integrated circuit packages that include an electrical integrated circuit (EIC) mounted on a photonic integrated circuit (PIC). The EIC includes at least one modulator driver and at least one transimpedance amplifier (TIA). The PIC includes at least one modulator and at least one photodetector. The modulators are each in electrical communication with a corresponding modulator driver and the photodetectors are each in electrical communication with a corresponding TIA. The PIC also includes waveguides for guiding optical signals to and from the modulators and to the photodetectors. The package encodes data from electrical signals into optical signals by modulating the optical signals using the modulators. The package encodes data from optical signals into electrical signals using the photodetectors. In this way, the package can route data to and from integrated circuits (e.g., processors or memory) that are in electrical communication with the EIC using optical signals.

In certain examples, the modulators are electro-absorption modulators (EAMs), e.g., EAMs formed in germanium silicon. Such modulators may be relatively insensitive to thermal changes compared to other types of modulators for ranges of operational wavelengths, e.g., modulators using resonant structures such as ring modulators. Such modulators may also be relatively compact compared to other types of modulators, e.g., interference based modulators, such as Mach-Zehnder modulators.

The relative thermal stability and compact size can allow circuit designs in which the modulators and/or photodiodes are positioned in close proximity to active electronic elements in the EIC, e.g., each modulator can be positioned in close proximity to its corresponding modulator driver and/or each photodetector can be positioned in close proximity to its corresponding TIA. Here, close proximity means that the components in the PIC experience substantial thermal loading when the EIC is active and can experience significant changes in temperature (e.g., changes of 10° C. or more, 20° C. or more, 30° C. or more) when switching between active and inactive states).

Positioning a modulator close to its corresponding driver and/or positioning a photodetector close to its corresponding transimpedance amplifier (TIA) can allow for relatively short electrical signal lines between the active element in the PIC and the active element in the EIC. In some cases, the lines can be sufficiently short that circuitry commonly used to reduce noise associated with longer signal lines can be omitted without unacceptable loss in fidelity of the electrical signals.

In some cases, the EIC can include other integrated circuits that generate significant thermal loads in the same chip as the drivers and TIAs. For example, the EIC can include one or more application specific integrated circuit (ASIC) in the same chip, e.g., circuits for performing processing of machine learning models.

In general, the photonic interconnect platform can be used to route data between nodes on the same chip (intra-chip routing) and between nodes on different chips (inter-chip routing). Both inter-chip and intra-chip routing can include routing data over electrical and/or photonic channels.

The present disclosure describes a system-in-package comprising: a photonic integrated circuit (PIC) comprising an active photonic component; and an electronic integrated circuit (EIC) stacked on the PIC and comprising: an electrical component electrically connected to a landing pad, and a copper pillar embedded in the landing pad and protruding from the landing pad to connect with the active photonic component such that the electrical component is electrically connected to the active photonic component, where the landing pad is sized to have a larger surface area than a cross sectional area of the copper pillar, and where, when viewed from the EIC towards the PIC, the active photonic component on the PIC is offset from the landing pad of the EIC.

The present disclosure also describes a method for providing a system-in-package including an electronic integrated circuit (EIC) and a photonic integrated circuit (PIC), the EIC including an electrical component electrically connected to a landing pad, the PIC including an active photonic component with a cathode and an anode. The method includes: physically attaching a copper pillar to the landing pad, the copper pillar protruding from the landing pad that is sized to have a larger surface area than a cross-sectional area of the copper pillar; and attaching a protruded portion of the copper pillar to electrically connect with the cathode or the anode of the active photonic component while stacking the EIC on the PIC such that, when viewed from the EIC towards the PIC stacked under, the active photonic component on the PIC is offset from the landing pad of the EIC.

The present disclosure also describes a system-in-package comprising: a photonic integrated circuit (PIC); an electronic integrated circuit (EIC); a plurality of electrical interconnects no longer than 100 μm in length connecting the EIC to the PIC; and a photonic channel interface optically connected to first and second unidirectional photonic links, the first unidirectional photonic link having an optical modulator at an input end and a waveguide connecting the optical modulator to an FAU, the second unidirectional photonic link having a photodetector at a receive end and a waveguide connecting the photodetector to a fiber array unit (FAU), where the photonic-channel interface includes a modulator driver for the first unidirectional photonic link optically connected thereto at the input end and a transimpedance amplifier for the second unidirectional photonic link with optically connected thereto at the output end.

Among other advantages, the example arrangements of electrical interconnects between an EIC and a PIC described herein can provide low latency, high bandwidth drive signals for optical modulation in the PIC and optical signals received by photodiodes in the PIC. For instance, the arrangements can provide short electrical paths from a driver to a modulator electrode and/or from a photodiode electrode to a receiver circuit in the EIC. The short electrical paths typically have lower parasitics and other sources of signal degradation between elements in the PIC and EIC, allowing for reliable, high frequency signal transmission. Specific relative arrangement of components in the PIC with respect to electrical components in the EIC can further reduce electrical interference between the EIC and the PIC. For example, laterally spacing inductive elements, e.g., an inductor in a phase locked loop (e.g., a Voltage Controlled oscillator (VCO) inductor), from electrical contacts or other conductors in the PIC can reduce interference between the inductive element and the active elements in the PIC. Alternatively, or additionally, laterally aligning inductive elements with a shield (e.g., a grounded shield) on the PIC, e.g., at the same level as the landing pads, can also reduce interference between the inductive element and the active elements in the PIC.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims or may be learned by the practice of the disclosed subject matter as set forth hereinafter.

BRIEF DESCRIPTION OF THE DRAWINGS

FIG. 1-2 is a block diagram illustrating various components of the example of the computing node of FIG. 1-1;

FIG. 1-3 is a block diagram illustrating various components of the example computing node of FIG. 1-1

FIG. 1-4 is a diagram illustrating a side view of an example structural implementation of the circuit package of FIG. 1-1;

FIG. 2-1 illustrates an example of a circuit package implementing an intra-chip bidirectional photonic channel between a first compute node and a second compute node;

FIG. 2-2 illustrates an example circuit package implementing an inter-chip bidirectional photonic channel between a compute node and an additional compute node located on an additional circuit package;

FIG. 3-1 is a schematic diagram showing, in a vertical cross-section, a portion of an AMS block and a portion of a PIC in an example system in package;

FIG. 3-2 is a schematic diagram showing, in a lateral section, a portion of the AMS block of the example system in package shown in FIG. 3-1;

FIG. 3-3 is a schematic diagram showing, in a lateral section, a portion of the PIC of the example system in package shown in FIG. 3-1;

FIG. 4-1 is a schematic diagram showing, in a vertical cross-section, a portion of an AMS block and a portion of a PIC in another example system in package;

FIG. 4-2 is a schematic diagram showing, in a lateral section, a portion of the AMS block of the example system in package shown in FIG. 4-1;

FIG. 4-3 is a schematic diagram showing, in a lateral section, a portion of the PIC of the example system in package shown in FIG. 4-1;

FIG. 5-1 is a schematic diagram showing, in a vertical cross-section, a portion of an AMS block and a portion of a PIC in yet another example system in package;

FIG. 5-2 is a schematic diagram showing, in a lateral section, a portion of the AMS block of the example system in package shown in FIG. 5-1;

FIG. 5-3 is a schematic diagram showing, in a lateral section, a portion of the PIC of the example system in package shown in FIG. 5-1;

FIG. 6-1 shows an example optical modulator inside a photonic integrated circuit (PIC) in plan view;

FIG. 6-2 shows details of electrical coupling layers for the optical modulator of FIG. 6-1;

FIG. 6-3 shows details of further electrical coupling layers for the optical modulator of FIG. 6-1;

FIG. 7-1 shows, in plan view, additional details of an electrical coupling to the a photodiode in a PIC;

FIG. 7-2 shows, in plan view, additional details of an electrical coupling to a modulator in a PIC;

FIG. 7-3 shows a portion of an example photonic integrated circuit (PIC) in plan view.

In the drawings, like elements are identified by like reference numbers.

DETAILED DESCRIPTION

Figure 1:
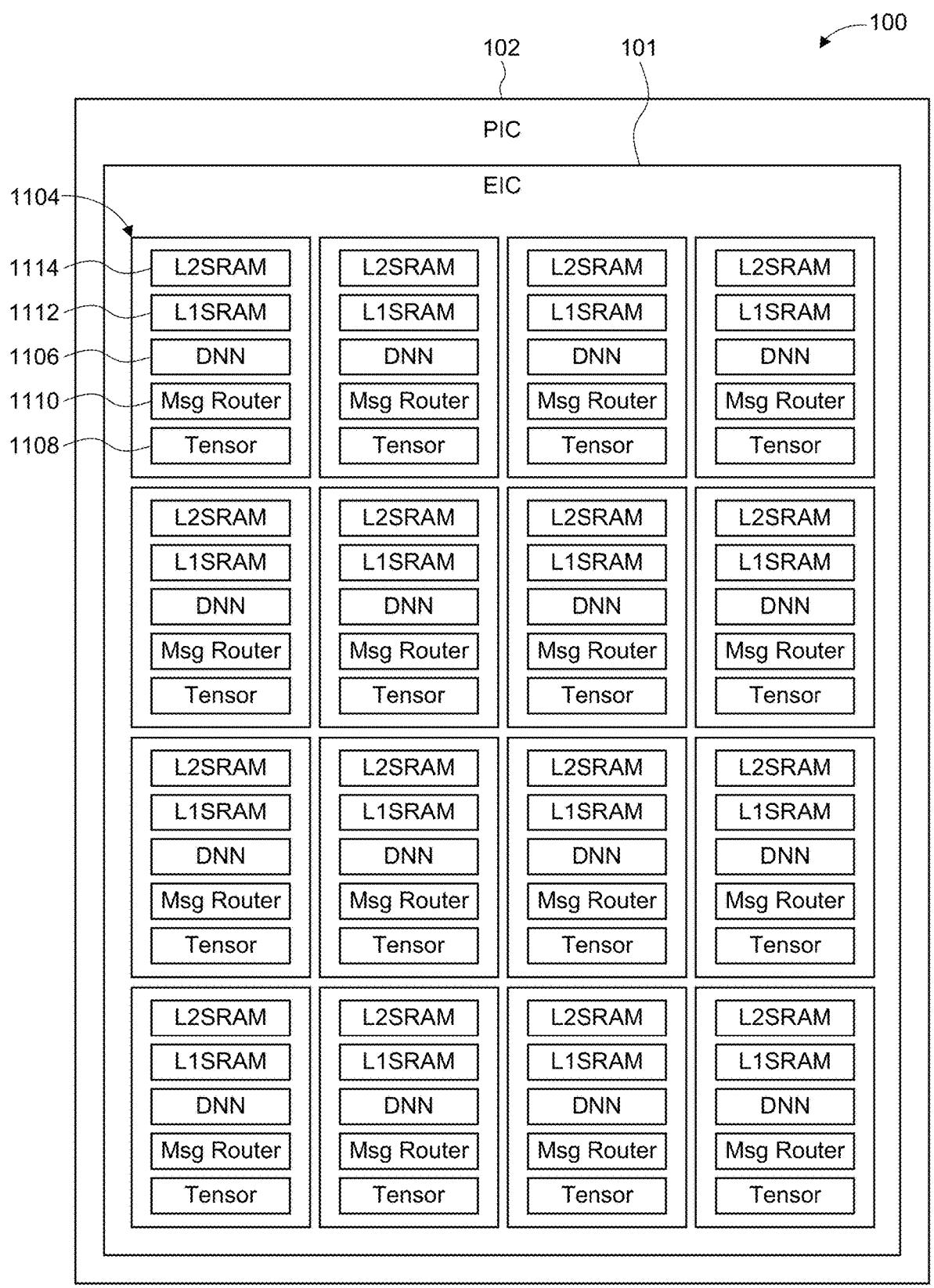
FIG. 1-1 is a diagram schematically illustrating components of an example system-in-package (SIP)

This description includes computing systems, implemented by one or more circuit packages (e.g., SIPs), that achieve reduced power consumption and/or increased processing speed. In accordance with various examples, power consumed for, in particular, data movement is reduced by increasing data locality in each circuit package and reducing energy losses when data movement is needed compared to conventional computer systems. Power-efficient data movement, in turn, can be accomplished by moving data over small distances in the electronic domain, while leveraging photonic channels for data movement in scenarios where the resistance in the electronic domain and/or the speed at which the data can move in the electronic domain leads to bandwidth limitations that cannot be overcome using existing electronic technology. Thus, in some examples, each circuit package includes an electronic integrated circuit (EIC) comprising multiple circuit blocks (hereinafter "processing elements" or "compute nodes") that are connected by bidirectional photonic channels (e.g., implemented in a PIC in a separate layer or chip of the package) into a hybrid, electronic-photonic (or electro-photonic) network-on-chip (NoC). Multiple such NoCs may be connected, by inter-chip bidirectional photonic channels between respective circuit packages (e.g., implemented by optical fiber), into a larger electro-photonic network, to scale the computing system to arbitrary size without incurring significant power or speed losses.

While the described computing systems and its various novel aspects are generally applicable to a wide range of processing tasks, they are particularly suited to implementing ML models, in particular artificial neural networks (ANNs). As applied to ANNs, a circuit package and system of interconnected circuit packages as described herein are also referred to as an "NL processor" and "ML accelerator,"

respectively. Neural networks generally include one or more layers of artificial neurons that compute neuron output activations from weighted sums (corresponding to MAC operations) of a set of input activations. For a given neural network, the flow of activations between nodes and layers is fixed. Further, once training of the neural network is complete, the neuron weights in the weighted summation, and any other parameters associated with computing the activations, are likewise fixed. Thus, a NoC as described herein lends itself to implementing a neural network by assigning neural nodes to compute nodes (processing element), pre-loading the fixed weights associated with the nodes into memory of the respective compute nodes and configuring data routing between the compute nodes based on the predetermined flow of activations. The weighted summation can be efficiently performed using a disclosed dot product engine, herein also called a "digital neural network (DNN)" due to its applicability to ANNs.

The foregoing high-level summary of various beneficial aspects and features of the disclosed computing systems and underlying concepts will become clearer from the following description of examples.

FIG. 1 is a diagram schematically illustrating components of an example circuit package 100 (e.g., SIP). The circuit package 100 may serve, for example, as an ML processor. The circuit package 100 includes an electronic integrated circuit 101 (EIC), such as, for example, a digital and mixed-signal application-specific integrated circuit (ASIC), and a photonic integrated circuit 102 (PIC). The EIC 101 and PIC 102 are formed in different layers of the circuit package 100 (herein the "electronic circuit layer" and "photonic circuit layer," respectively), one stacked above the other, for example, using copper pillars, bump attachments, or other means to create an electrical interconnect to transmit and receive messages, packets, and/or data between the EIC and the PIC, as illustrated further below with reference to FIG. 1-4. The PIC or PICs 102 receive light from one or more laser light sources that may be integrated into the PIC 102 itself or implemented separately from the PIC 102 either within or externally to the circuit package 100 and connected into to the PIC 102 via suitable optical couplers. The optical couplers and laser sources are omitted from FIG. 1-1, but shown, for example, in FIG. 1-4. Generally, the laser sources and optical couplers are selected to provide optical signals within a band of wavelengths for which the PIC 102 and other optical components in the system are intended to operate. In some examples, the operational wavelengths are in a range from 1,500 nm to 1,600 nm (e.g., in the band of the spectrum referred to as the C-band and/or L-band).

The EIC 101 includes multiple processing elements or compute nodes 1104. As will be discussed herein in detail, the compute nodes 1104 may communicate with each other via one or more intra-chip bidirectional channels. The intra-chip bidirectional channels may include one or more bidirectional photonic channels (e.g., implemented with optical waveguides in the PIC 102) and/or one or more electronic channels (e.g., implemented in the circuitry of the EIC 101). The compute nodes 1104 may (although they need not in all examples) be electronic circuits identical (or at least substantially similar) in design, and as shown, may form "tiles" of the same size arranged in an array, matrix, grid, or any other arrangement suitable for performing the techniques described herein. Hereinafter, the words "processing element," "compute node," and "tile" are used synonymously. In the present example, the EIC 101 has sixteen compute nodes 1104, or tiles, arranged in a four-by-four array, but the number and arrangement of tiles can generally vary. More generally, neither the shape of the tiles nor the grid in which they are arranged need necessarily be rectangular; for example, oblique quadrilateral, triangular, or hexagonal shapes and grids, as well as topologies with 3 or more dimensions can also be used. Further, although tiling may provide for efficient use of the available on-chip real-estate, the compute nodes 104 need not be equally sized and regularly arranged in all examples. As shown in FIG. 1-1, in some examples, the compute nodes 104 are arranged in a rectilinear array, such as a square (e.g., conceptually) array.

Each compute node 1104 in the EIC 101 may include one or more circuit blocks serving as processing engines. For example, in the implementation shown in FIG. 1-1, each compute node 1104 includes a dot product engine, or DNN, 1106 and a tensor engine 1108. The DNN 1106 can perform rapid MAC operations at reduced energy per MAC to execute either a convolution function or a dot product function, e.g., as routinely used in neural networks. The tensor engine 108 may be used to perform other, non-MAC operations, e.g., implementing non-linear activation functions as applied to the weighted sums in a neural network. In other examples, the compute node 1104 can have any combination of processing elements such as CPUs, GPUs, TPUs, and the like, and the DNN 1106 and tensor engine 1108 can also be included or omitted depending on the application.

Each compute node 1104 includes a message router 1110. The message routers 1110 interface with channels (e.g., electronic and/or photonic channels as described below in connection with FIG. 1-2) to facilitate data flow to and from the compute nodes 1104. Further, the compute nodes 1104 each have a memory system, e.g., including level-one static random-access memory (L1SRAM) 1112 and level-two static random access memory (L2SRAM) 1114. L1SRAM 1112 is optional and, if included, can serve as scratchpad memory for each compute node 1104. L2SRAM 1114 may function as the primary memory for each compute nodes 1104 and may store certain fixed operands used by the DNN 1106 and tensor engine 1108, such as the weights of a machine learning model, in close physical proximity to the DNN 1106 and tensor engine 1108. L2SRAM 1114 may also store any intermediate results used in executing the machine learning model or other computation.

Figures 1, 2:
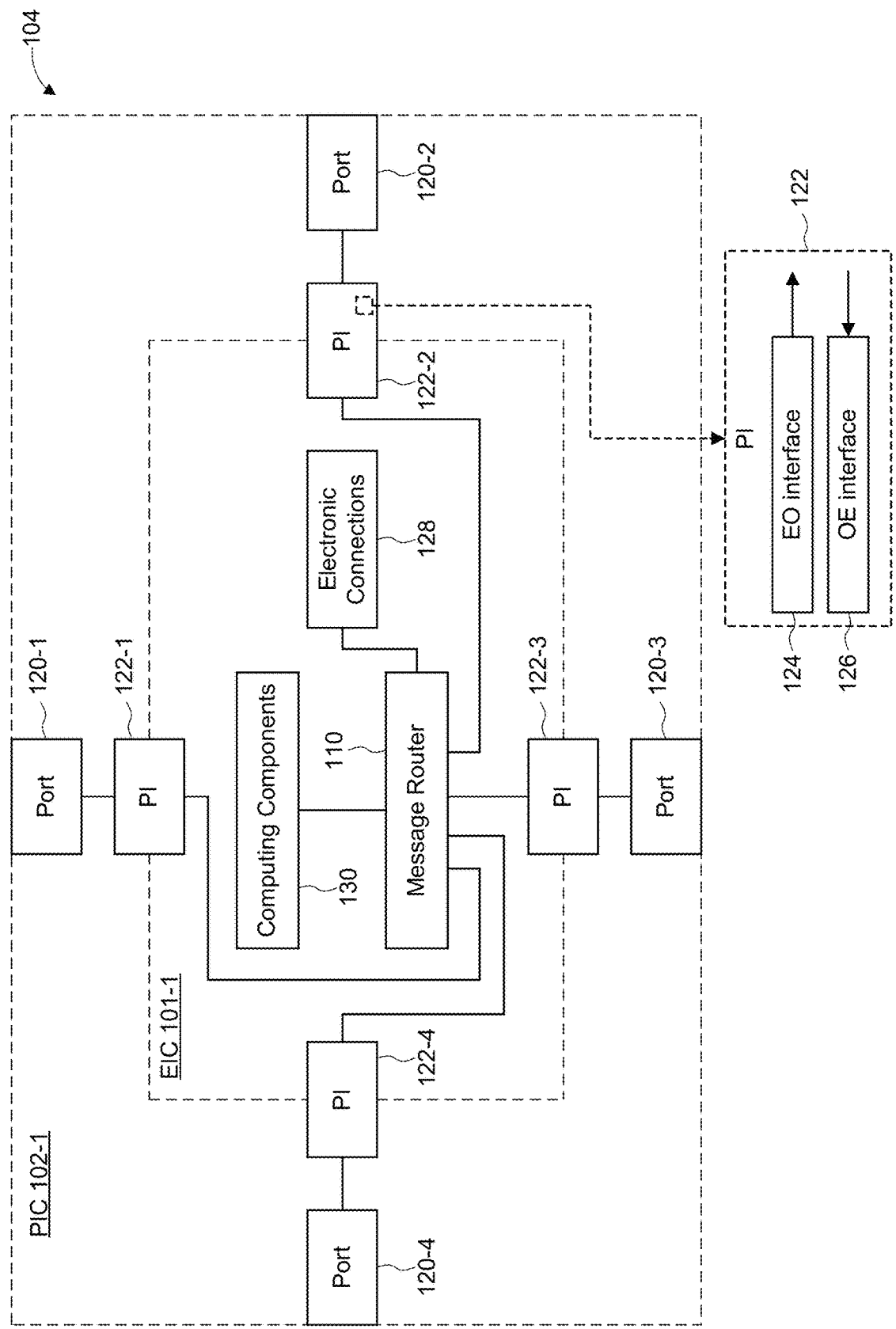

FIG. 1-2 is a block diagram illustrating various components of an example of the compute node 1104 of FIG. 1-1. Here, a compute node 104 includes various computing components 130, which may include the DNN 1106, the tensor engine 1108, interface controllers, routing controllers, the L1SRAM 1112 and/or the L2SRAM 1114 of FIG. 1-1, among other components. In some examples, the computing components 130 include memory components (e.g., a memory controller, vertically stacked high-bandwidth memory, etc.) such that the compute node 104 may be a memory node as will be described herein. The computing components 130 are implemented on an EIC 101-1 of the compute node 104 and are in communication with the message router 110. For example, the message router 110 may receive messages from another computing component via one of optical ports or electronic connections 128, and additionally may send messages generated by the respective compute node 104 of the message router 110 via one of the optical ports or the electrical connects 128. The message router is implemented on the EIC 101-1 and may be implemented through hardware, software, or a combination of hardware and software. The message router is shown as a single block but can also include a message router associated with each photonic interface. The PIC 102 and EIC 101 as shown in FIG. 1-2 may be a portion of the PIC 102 and/or EIC 101 of FIG. 1-1 and may include various other computing componentry.

In some examples, the compute node 104 connects to one or more computing components through electronic channels (e.g., intra-chip electronic channels). For example, (as will be discussed below in detail) the various compute nodes 104 in FIG. 1-1 may each connect to adjacent nodes via the electronic channels. The compute node 104 may connect to any other computing component through one or more electronic channels. In some examples, the compute node 104 is configured to connect to up to 4 adjacent compute nodes 104 through electronic channels. In some examples, the compute nodes 104 are configured to connect to additional componentry and/or nodes through electronic connections, such as other on-chip components, or can process data in the electrical domain within the compute node 104, using an electrical port (not shown) which is included in block 128. The electronic channels connected to the compute node 104 may each connect to the message router 110, represented by electronic connections 128. The electronic connections 128 may be implemented in the EIC 101 of the compute node 104. Messages or packets sent through the electronic connections 128 may therefore pass to and be acted on by the message router 110 to forward those messages on to additional computing components, or to pass the messages internally to the computing components 130 of the computing node 104. In this way, the computing node 104 (and more specifically the message router 110) may be configured to connect to and communication with one or more computing components through the electronic connections 128.

In some examples, the compute node 104 is configured to connect to one or more optical connections or photonic channels. For example, as shown in FIG. 1-2, the compute node 104 includes four photonic ports 120-1, 120-2, 120-3, and 120-4 (collectively, photonic ports 120). The four photonic ports 120-1 to 120-4 connect to four photonic channels. The photonic ports 120 facilitate connecting a photonic connection to the compute nodes 104. For example, the photonic ports 120 may include and/or may connect to one or more waveguides to direct an optical signal to and/or from the compute node 104. The photonic ports 120 are implemented in the PIC 102-1. In some examples, the photonic channels are bidirectional photonic channels to facilitate both sending and receiving communications through the photonic ports 120. For example, each bidirectional photonic channel may include two or more unidirectional links (e.g., one or more sending links and one or more receiving links). The unidirectional links may be associated with and may connect to respective sending and receiving components of the photonic interfaces 122, as discussed below. In this way, the photonic ports 120 facilitate connecting the compute node 104 to one or more bidirectional photonic channels to communicate photonically with other computing devices.

Each of the photonic ports 120 is associated with and connected to a corresponding photonic interface 122 (PI) (photonic port 120-1 is connected to photonic interface 122-1, etc.). The photonic interfaces 122 facilitate converting a message or a signal between the electronic domain and the photonic domain. In particular, each photonic interface (e.g., as illustrated for photonic interface 122-2) includes an electrical-to-optical (EO) interface 124 for converting electronic signals to optical (e.g., photonic) signals, and include an optical-to-electrical (OE) interface 126 for converting signals to electronic signals. While FIG. 1-2 only shows PI 122-2 as having the EO interface 124 and OE interface 126, it should be understood that each of the PIs 122 may include one or both of these interfaces and typically includes multiple each to support multiple unidirectional photonic links in both directions connecting to the port, for example, to support wavelength division multiplexing (WDM) or other scheme.

Figures 1, 2, 3:
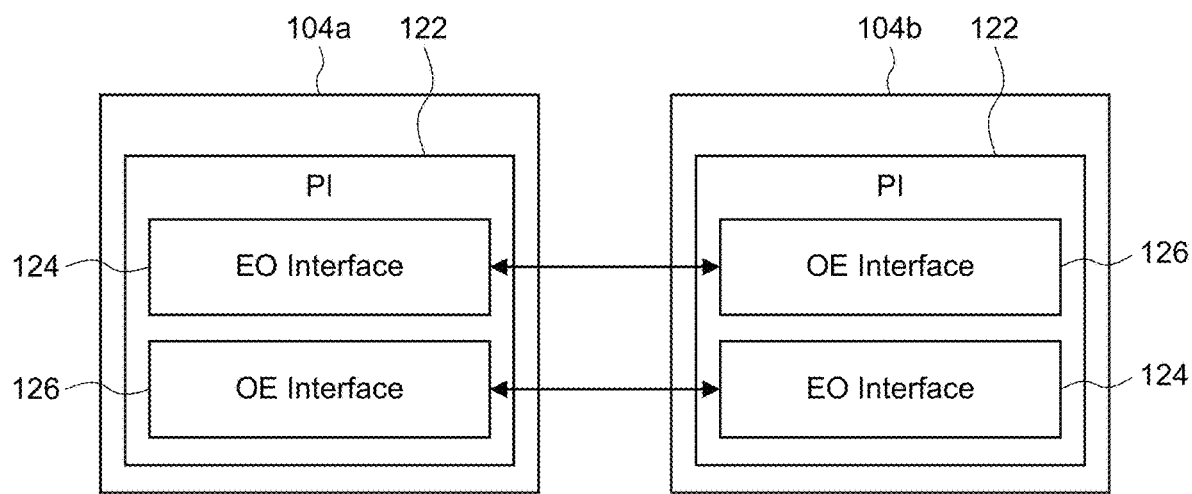

As discussed above, each bidirectional photonic channel may include two or more unidirectional photonic links. Each unidirectional photonic link may include or may be associated with both an EO interface 124 and an OE interface 126. For example, as shown in FIG. 1-3, an EO interface 124 of a compute node 104a connects (e.g., via photonic ports 120 and waveguides, etc.) to an OE interface 126 of another computing device 104b (e.g., another instance of the compute node) to form a unidirectional photonic link for sending packets from the compute node 104a to the other computing device 104b. Similarly, an EO interface 124 of the other computing device 104b connects to an OE interface 126 of the compute node 104a to form a unidirectional link for receiving packets to the compute node 104a from the other computing device 104b. In this way, the PIs 122 may facilitate bidirectional communication over the bidirectional photonic channels connected to the photonic ports 120.

In some examples, the PIs 122 each include various optical and electronic components. For example, the EO interface 124 can include an optical modulator and an optical modulator driver. The optical modulator generally operates on an optical (e.g., laser light) carrier signal to encode information into the optical carrier signal and thereby transmit information optically/photonically. The optical modulator may be controlled or driven by the optical modulator driver. The optical modulator driver may receive an electronic signal (e.g., packet encoded into an electronic signal) from the message router 110 and may control a modulation of the modulator to convert or encode the electronic signal into the optical signal. In this way the optical modulator and driver may make up the EO interface 124 to facilitate optically transmitting messages from the compute node 104.

The modulator can be an electro-absorption modulator (EAM) which is a semiconductor device that includes a diode junction that modulates the intensity of an optical signal by varying absorption of the optical signal as it traverses the modulator based on an applied electric voltage to the EAM. Generally, the principle of operation of an EAM is based on the Franz-Keldysh effect, i.e., a change in the absorption spectrum caused by an applied electric field, which changes the bandgap energy (thus the photon energy of an absorption edge) but usually does not involve the excitation of carriers by the electric field.

In examples, EAMs are made in the form of a waveguide with electrodes for applying an electric field in a direction perpendicular to the modulated optical signal. In certain examples, the EAM is implemented in a layer of Germanium Silicon, e.g., an epitaxially-grown layer of GeSi. Germanium can stoichiometrically constitute 90% or more of the GeSi material (e.g., 95% or more, 96% or more, 97% or more, 98% or more, 99% or more).

In some examples, the OE interface 126 includes a photodiode and a transimpedance amplifier (TIA). The photodiode receives an optical signal (e.g., from another computing device) through a unidirectional link of the bidirectional photonic channel and converts the optical signal into an electronic signal. The photodiode may be connected to the TIA which may include componentry and/or circuitry for gain control and normalizing the signal level to extract and communicate a bit stream to the message router 110. In this way, the OE interface 126 may include the photodiode and the TIA to facilitate optically receiving messages to the compute node 104.

In some examples, the PIs 122 are partially implemented in the PIC 102-1 and partially implemented in the EIC 101-1. For example, the optical modulator may be implemented in the PIC 102-1 and may be electrically connected to the optical modulator driver implemented in the EIC 101-1. For example, the EIC 101-1 and the PIC 102-1 may be vertically stacked, and the optical modulator and the optical modulator driver may be connected through an electrical interconnect of the two components such as a copper pillar and/or bump attachment of various sizes. Similarly, the photodiode may be implemented in the PIC 102-1 and the TIA may be implemented in the EIC 101-1. The photodiode and the TIA may be connected through an electrical interconnect of the two components.

As shown in FIG. 1-2, each PI 122 is in communication with the message router 110. The PIs 122 are connected to the message router 110 through electrical interconnects in the EIC 101-1. The PIs 122 communicate with the message router 110 to transmit signals to and/or receive signals to or from the message router 110. In some examples, the message router 110 includes electronic circuitry and/or logic to facilitate converting a data packet into an electronic signal and then an optical signal in conjunction with the EO interface 124. Similarly, the message router 110 may include electronic circuitry and/or logic to facilitate converting an optical signal into an electronic signal and then into a data packet in conjunction with the OE interface 124. In this way the message router 110 may facilitate converting and/or operating on data between the electronic domain and the optical domain.

The message router 110 may facilitate routing information and/or data packets to and/or from the compute node 104. For example, the message router 110 may examine an address contained in the message and determine that the message is destined for the compute node 104. The message router 110 may accordingly forward or transmit some or all of the message internally to the various computing components 130 of the compute node 104 (e.g., via an electronic connection). In another example, the message router 110 may determine that a message is destined for another computing device (e.g., the message either being generated by the compute node 104 or received from one computing device for transmission to another computing device). The message router 110 may accordingly forward or transmit some or all of the message through one or more of the channels (e.g., electronic or photonic) of the compute node 104 to another computing device. In this way, the message router 110 in connection with the electronic connections 128 and the bidirectional photonic channels connected to the photonic ports 120 may facilitate implementing the compute node 104 in a network of computing devices for generating, transmitting, receiving, and forwarding messages between various computing devices. In some examples, the compute node 104 is implemented in a network of multiple compute nodes 104 such as that shown in FIG. 1-1.

The PIC 102-1 includes one or more waveguides. A waveguide is a structure that guides and/or confines light waves to facilitate the propagation of the light along a desired path and to a desired location. For example, a waveguide may be an optical fiber, a planar waveguide, a glass-etched waveguide, a photonic crystal waveguide, a free-space waveguide, any other suitable structure for directing optical signals, and combinations thereof. In some examples, one or more internal waveguides are formed in the PIC 102-1. In certain examples, one or more external waveguides are implemented external to the PIC 102-1, such as an optical fiber or a ribbon comprising multiple optical fibers.

The PIC 102-1 may include one or more waveguides in connection with the photonic ports 120. For example, one or more of the photonic ports 120 may be connected to another port of another computing node included in the circuit package 100 (e.g., on a same chip) as the computing node 104. Such connections may be intra-chip connections. In some examples, an internal waveguide is implemented (e.g., formed) in the PIC 102-1 to connect these photonic ports internally to the chip. In another example, one or more photonic ports 120 may be connected to a photonic port of another computing device located in a separate circuit package or separate chip to form inter-chip connections. In some examples, an external waveguide is used to connect these photonic ports across the multiple chips. For example, the photonic ports 120 may be connected via optical fiber across the multiple chips. In some examples, an external waveguide (e.g., optical fiber) connects directly to the photonic ports 120 of the respective computing devices across the multiple chips. In some examples, an external waveguide is implemented in connection with one or more internal waveguides formed in the PICs 102 of one or more of the chips. For example, one or more internal waveguides may internally connect the one or more of the photonic ports 120 to one or more additional optical components located at another portion of the circuit package (e.g., another portion of the PIC 102) to facilitate coupling of optical signals to and/or from the external waveguides. For example, the internal waveguides may connect to one or more optical coupling structures including fiber array units (FAUs) located over grating couplers. Alternatively, edge couplers, which abut the edge of the PIC, can be used. In some examples, one or more FAUs are implemented to facilitate coupling the external waveguides to the internal waveguides to facilitate chip-to-chip interconnection to another circuit package to both transmit and receive. For example, one or more FAUs can be used to supply optical power from an external laser light source to the PIC 102-1 to drive the photonics (e.g., provide one or more carrier signals) in the PIC 102-1.

FIG. 1-4 is a diagram illustrating a side view of an example structural implementation 1400 of the circuit package 100 of FIG. 1-1. In this example, an EIC 1401 and a PIC 1402 are formed in separate semiconductor chips (typically silicon chips, although the use of other semiconductor materials is conceivable). PIC 1402 is disposed directly on a substrate 1440, shown with solder bumps for subsequent mounting to a printed circuit board (PCB). The EIC 1401 and FAUs 1432 that connect the PIC 1402 to external waveguides 1433 (e.g., optical fibers) are disposed on top of and optically connected to the PIC 1402. Optionally, and as will be discussed below, the circuit package 1400 may further include, as shown, an on-chip memory 1442 positioned on top of the PIC 1402 adjacent to the EIC 1401.

As will be appreciated by those of ordinary skill in the art, the depicted structure of the circuit package 1400 is merely one of several possible ways to assemble and package the various components. In some examples, some or all of the EIC 1401 is disposed on the substrate. In some examples, some or all of the PIC 1402 is placed on top of the EIC 1401. In some examples, it is also possible to create the EIC 1401 and PIC 1402 in different layers of a single semiconductor chip. In some examples, the photonic circuit layer includes or is made of multiple PICs 1402 in multiple sub-layers.

Multiple layers of PICs 1402, or a multi-layer PIC 1402 may help to reduce waveguide crossings. Moreover, the structure depicted in FIG. 1-4 may be modified to included multiple EICs 1401 connected to a single PIC 1402. For example, the multiple EICs 1401 may be connected to each other via photonic channels in the PIC 1402.

In general, the EICs and PICs described herein can be manufactured using standard wafer fabrication processes, including, e.g., photolithographic patterning, etching, ion implantation, etc. Further, in some examples, heterogeneous material platforms and integration processes are used. For example, various active photonic components, such as the laser light sources and/or optical modulators and photodetectors used in the photonic channels, may be implemented using group III-V semiconductor components.

The laser light source(s) can be implemented either in the circuit package 1400 or externally. When implemented externally, a connection to the circuit package 1400 may be made optically using a grating coupler in the PIC 1402 underneath an FAU 1432 as shown and/or using an edge coupler. In some examples, lasers are implemented in the circuit package 1400 by using an interposer containing several lasers that can be co-packaged and edge-connected with the PIC 1402. In some examples, the lasers are integrated directly into the PIC 1402 using heterogenous or homogenous integration. Homogenous integration allows lasers to be directly implemented in the silicon substrate in which the waveguides of the PIC 1402 are formed, and allows for lasers of different materials, such as indium phosphide (InP), and architectures such as, quantum dot lasers. Heterogenous assembly of lasers on the PIC 1402 allows for group III-V semiconductors or other materials to be precision-attached onto the PIC 1402 and optically connected to a waveguide implemented on the PIC 1402.

Several circuit packages 1400, may be interconnected to result in a single system providing a large electro-photonic network (e.g., by connecting several chip-level electrophotonic networks as described below). Multiple circuit packages configured as ML processors may be interconnected to form a larger ML accelerator. For example, the photonic channels within the several circuit packages or ML processors, the optical connections, the laser light sources, the passive optical components, and the external optical fibers on the PCB, may be utilized in various combinations and configurations along with other photonic elements to form the photonic fabric of a multi-package system or multi-ML-processor accelerator.

FIG. 2-1 illustrates an example of a circuit package 300 implementing an intra-chip bidirectional photonic channel 342 between a first compute node 304-1 and a second compute node 304-2. The circuit package 300 includes various electronic and optical components implemented across an EIC 301 and a PIC 302. Package 300 includes two compute nodes 304-1 and 304-2 (collectively, compute nodes 204) which each include a respective compute block 358-1 and 358-2 which may include various processing, storage, and/or communication functions. The compute nodes 304 each include an analog-mixed signal (AMS) block 360-1 and 360-2 (collectively, AMS blocks 360) that includes analog/mixed signal circuits for interfacing with the PIC 302. The compute blocks 358 each include an interface 292-1 and 292-2 (collectively, interfaces 292) for communicating with the AMS blocks 360, or more specifically, with the componentry of the AMS blocks 360. In general, an AMS block includes a transceiver circuit for driving a corresponding modulator in the PIC and a receiver circuit for receiving signals from a corresponding photodiode in the PIC. Here, the AMS blocks 360 each include a modulator driver 362-1 and 362-2 (collectively, drivers 362) and each include a transimpedance amplifier 364-1 and 364-2 (collectively, TIAs 264).

The PIC 302 includes a pair of modulators 356-1 and 356-2 and a pair of photodetectors 366-1 and 366-2. The PIC 302 also includes a grating coupler 354 (or any other optical interface (OI) configured to receive and pass on light to one or more components) and a splitter 368.

A light engine 350 provides an optical carrier signal for communication between the first compute node 304-1 and second compute node 304-2. The light engine 350 provides the carrier signal to a FAU 332 of the circuit package 300, such as through an optical fiber. The FAU 332 is optically connected to the grating coupler 354 which directs the optical carrier signal on to other components of the electronics package 300. A splitter 368 receives the optical carrier signal from the grating coupler 354 and splits the optical signal along two optical paths 370 and 372. More generally, the splitter 368 may distribute the optical carrier signal over any number of photonic paths consistent with that described herein. The optical paths 270 and 272 may be implemented as any suitable optical transmission medium and may include a mixture of waveguides and optical fibers, or any other transmission medium consistent with that described herein. In the present example, the optical paths 270 and 272 are implemented as waveguides in the PIC 302.

The optical paths 370 and 372 pass from the splitter 368 to the optical modulators 356-1 and 356-2, respectively. Each optical modulator modulates the optical carrier signal it receives from the splitter 368 based on information from its respective optical driver 362-1 and 362-2 and transmits the modulated signal along the respective optical path. A first photodetector 266-1 receives the modulated signal from the optical path (e.g., from the associated modulator 256). As depicted, the optical path from modulator 356-1 connects to photodetector 266-2 and the optical path from modulator 356-2 connects to photodetector 266-1. The photodetectors convert the received modulated signal into respective electrical signal and pass the electrical signals to transimpedance amplifiers 264 which facilitate the compute nodes 304-1 and 304-2 receiving the information encoded in the signals. In this way, communication occurs between the compute nodes through the various components just described. The PIC 302 described here includes an example of an intra-chip bidirectional photonic channel, including two unidirectional photonic links for facilitating communications both to and from each compute node. Here, the first unidirectional photonic link is defined by the modulator driver 362-1, the optical modulator 356-1, the optical path 370, the photodiode 366-2, and the transimpedance amplifier 364-2. Similarly, the second unidirectional link is defined by the modulator driver 362-2, the optical modulator 356-2, the optical path 370, the photodiode 366-1, and the transimpedance amplifier 364-1. The first and second unidirectional links operate in opposite directions. Additionally, one or more of the compute nodes 304 may include one or more serializes and/or a deserializes for further facilitating communications of signals between the compute nodes 304. In this way, the two unidirectional photonic links form the intra-chip bidirectional photonic channel 342.

FIG. 2-2 illustrates an example circuit package 200 implementing an inter-chip bidirectional photonic channel between the compute node 304 and an additional compute node 254 located on an additional circuit package 290, such as a memory node on a memory circuit package. The compute node 304 and/or the electronics package 200 may include the EIC 301 and the PIC 302 including the components discussed above in connection with FIG. 2-1. Further, PIC 302 includes a demultiplexer 380 and a multiplexer 390. In general, a demultiplexer and multiplexer can be used in a PIC for wavelength division multiplexing of optical signals.

In the inter-chip configuration shown in FIG. 2-2, the optical modulator 356 transmits a modulated signal along an optical path 374 to the grating coupler 354. The modulated signal is passed through the multiplexor 390 prior to passing to the grating coupler 354. From the grating coupler 354, the modulated signal travels through the FAU 332 and along an optical fiber to another grating coupler of the additional circuit package 290, where the receiving componentry of the additional circuit package 290 receives and processes the incoming signal. The receiving componentry may be the same as or similar to the receiving componentry of the circuit package 300 discussed above or may include any other means for receiving and processing the incoming signal.

Similarly, the additional circuit package 290 generates and transmit a signal to the compute node 304. The additional circuit package 290 may generate and transmit the signal using transmitting componentry that may include transmitting componentry similar to or the same as that of the circuit package 300 discussed above, or any other means. The additional circuit package 290 transmits a signal, for example, along an optical fiber to the FAU 332 and grating coupler 354 of the compute node 304. The signal travels along an optical path 276 to the photodetector 366 which converts the optical signal to an electrical signal as discussed herein. The received signal passes through the demultiplexer 280 prior to passing to the photodetector 266. In this way, an inter-chip bidirectional photonic channel is defined by two unidirectional photonic links. Here, the first unidirectional photonic link is defined by the modulator driver 362, the optical modulator 356, the optical path 374, the multiplexer 378, the grating coupler 354, the FAU 332, an optical fiber, and receiving componentry of the additional circuit package. Similarly, the second unidirectional photonic link is defined by the transmitting components of the additional circuit package 290, the optical fiber, the FAU 332, the grating coupler 354, the demultiplexer 380, the optical path 376, the photodetector 366, and the transimpedance amplifier 364. The first and second unidirectional photonic links operate in opposite directions. In this way the two unidirectional photonic links forms the inter-chip bidirectional photonic channel. Furthermore, unmodulated light from an external light source can also be provided to the PIC through the FAU 332.

Referring to FIGS. 3-1 through 3-3, a portion 400 of an example circuit package includes an EIC 401 stacked on a PIC 402 with electrical interconnects that include copper pillars 410 electrically connecting an AMS block 404 in the EIC 401 to an active element 426 in the PIC. Generally, an electrical interconnect refers to one or more electrically conducting elements connected in parallel and/or series that forms a conduit for electrical signals between two elements. Electrical interconnects can include, for example, copper pillars, landing pads, vias (e.g., through silicon vias, through dielectric vias), and conducting lines, alone, or in any combination. FIG. 3-1 schematically shows the portion 400 in cross section through a vertical plane, while FIG. 3-2 and FIG. 3-3 show, respectively, the layout of components of the EIC 401 and PIC 402 through lateral planes of the circuit package. A Cartesian coordinate system is shown for ease of reference. Here, the x-y plane is referred to as the lateral plane, while the z-direction is the vertical direction.

The EIC 401 is composed of multiple layers lithographically patterned to contain an AMS block 404. The AMS block 404 includes one or more drivers and/or one or more TIAs. As shown, EIC 401 is composed of a base portion 471 (e.g., composed of one or more layers of semiconductor material), an electrically conducting portion 470, and an insulating portion 460 which provides the bottom surface of the EIC. Although these portions are depicted as three layers in FIG. 3-1, in general they can be constituted from one or more layers of different materials and each layer can be patterned to provide regions that serve different functions (e.g., transistors, diodes, other electrical elements, and components composed of the elements). For example, portion 470 can include one or more patterned layers of electrical conductors that facilitate electrical connection between the bottom surface of the EIC 401 and components in the AMS block 404. The electrical contacts 462 (e.g., landing pads, also referred to as bumps) are connected to the electrically conducting portion 470 through insulating portion 460 by electrical connectors 461 (e.g., vias). The electrical contacts 462 are formed by an outermost metal layer that is buried under an oxide layer 463 that provides the outermost surface of the EIC 401.

Electrically conducting portion 470 also includes an inductor 406 (e.g., a VCO inductor) as part the AMS block. The inductor 406 is part of a phase locked loop (PLL) in the AMS block 404 that fixes the relative phase of different electrical signals generated by the AMS block. The PLL generates a high frequency clock used in the transceiver and receiver circuits of the AMS. For example, in a single AMS channel that interfaces with four bidirectional links, a PLL can provide a high frequency signal for timing electrical signal delivery to the modulators and electrical signal receipt from the photodiodes in the PIC associated with the AMS channel.

PIC 402 includes a base portion 419, a waveguide portion 420, an electrically conducting portion, and an insulating portion 435 that provides the top surface of the PIC 402. Although these portions are depicted as four layers in FIG. 3-1, in general they can be constituted from one or more layers of different materials and each layer can be patterned to provide regions that serve different functions (e.g., waveguides, active photonic components, and/or electrical components such as conductors, inductors, capacitors, resistors, etc.) As shown, PIC 402 includes an active photonic component 426 (in this case, a modulator) which includes a junction 427, a cathode 428, and an anode 429. A first waveguide 422 delivers optical signals to the junction 427 and a second waveguide 424 receives an optical signal from the junction. Generally, the active photonic components can be a photodiode or other photodetector, or a modulator (e.g., an EAM), such as the examples described herein. Electrically conducting lines 436 and 437 connect anode 429 and cathode 428, respectively, to electrical contacts 432 (e.g., landing pads as described elsewhere herein) near the top surface of the PIC 402. The electrical contacts 432 are formed in an outermost metal layer of the PIC 402, which is buried under an oxide layer 439 that forms the outermost surface of the PIC 402. The electrical contacts are connected to the electrically conducting portion 430 through insulating portion 435 by electrical connectors 434 (e.g., vias). During operation, the package biases one of the electrodes (e.g., anode 429) with a DC voltage (e.g., the electrode can be grounded) while the driver in the AMS block 404 drives the modulator 426 by providing an AC signal to the cathode 428 (e.g., in a range from 1 GHz to 100 GHz).

The bottom surface of the EIC 401 and the top surface of the PIC 402 are separated by a space 450 that is filled with a molding compound (e.g., an epoxy molding compound). Copper pillars 410 form electrical connections between the electrical contacts 462 on the bottom surface of EIC 401 and the electrical contacts 432 on the top surface of the PIC 402. The pillars penetrate through the oxide layers 439 and 463 to physically contact the electrical contacts underlying the oxide layers. The pillars 410 can be centered on the electrical contacts 462 and/or 432 or can be offset from the centers.

As viewed laterally, inductor 406 overlaps a region 407 in the PIC 402 that is free of electrical contacts 432 and/or other electrical conductors, e.g., lines 436 and 437, in the PIC. As shown, this vacant region 407 is laterally displaced by at least a distance d407 in the x-y plane, where d407 can be 1 micrometer or more (e.g., 5 micrometers or more, 10 micrometers or more, 20 micrometers or more, 50 micrometers or more, such as 100 micrometers or less, 70 micrometers or less). The vacant area 407 can have at least one lateral dimension (e.g., orthogonal lateral dimensions, such as a dimension in the x-direction and in the y-direction) of 10 micrometers or more (e.g., 20 micrometers or more, 50 micrometers or more, 100 micrometers or more, 150 micrometers or more, 200 micrometers or more, such as 500 micrometers or less, 400 micrometers or less). In certain examples, the vacant area 407 has one lateral dimension in a range from 100 micrometers to 200 micrometers (e.g., about 125 micrometers, about 150 micrometers, about 175 micrometers) and a second, orthogonal lateral dimension in a range from 50 micrometers to 100 micrometers (e.g., about 75 micrometers, about 90 micrometers).

The electrical contacts 432 are displaced from the center of the active photonic component 426 by a distance d432, which can be 1 micrometer or more (e.g., 2 micrometers or more, 5 micrometers or more, such as 10 micrometers or less, 8 micrometers or less). In some examples, the electrical contacts overlap with the active photonic component 426.

During operation, the inductor 406 creates local magnetic fluxes, which may impact the operation of nearby components, e.g., in the EIC or in the PIC, and/or the presence of conductors (e.g., with varying potentials) in the PIC may affect the operation of the inductor. For example, when metalized components are nearby the inductor, e.g., electrical conductors, unintended mutual inductance can be created that hinder the operation of components of the EIC-PIC stacked package. For these reasons, electrical contacts are not provided in the surrounding area of the inductor on other layers of the EIC, or on the PIC, and copper pillars are not located in this area in the EIC-PIC stacked package.

Generally, the active photonic component 426 is sufficiently close to the AMS block 404 that the electrical interconnects electrically connecting the active photonic component and the AMS block is relatively short, e.g., sufficiently short that it is unnecessary to include elements between the AMS block and the component to maintain signal integrity. For example, no repeaters or filters for reducing noise are needed. The electrical interconnect can be 100 µm or less in length (e.g., 80 µm or less, 50 µm or less, 30 µm or less, 20 µm or less, 10 µm or less). However, the proximity of the active photonic component to the AMS block can subject the active photonic component to significant thermal variations depending on the varying data load carried over the photonic channel. For example, temperature variations of 10° C. or more (e.g., 20° C. or more, 30° C. or more, 40° C. or more) can occur for periods of seconds or even fractions of a second. It is believed that an EAM can maintain satisfactory operation while experiencing such temperature fluctuations, e.g., by varying a DC reverse bias across the diode junction.

Figures 1, 2, 3, 4:
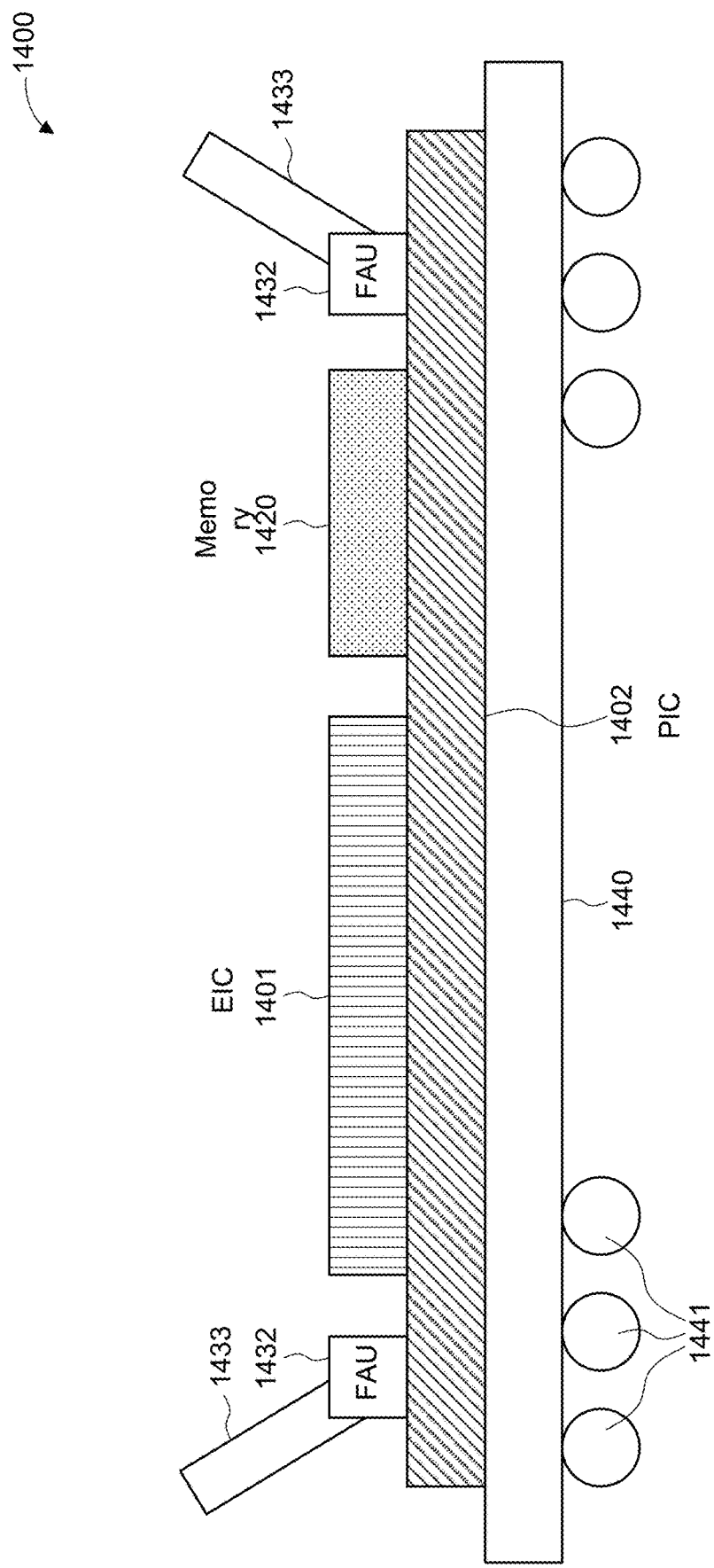
Figures 1, 2:
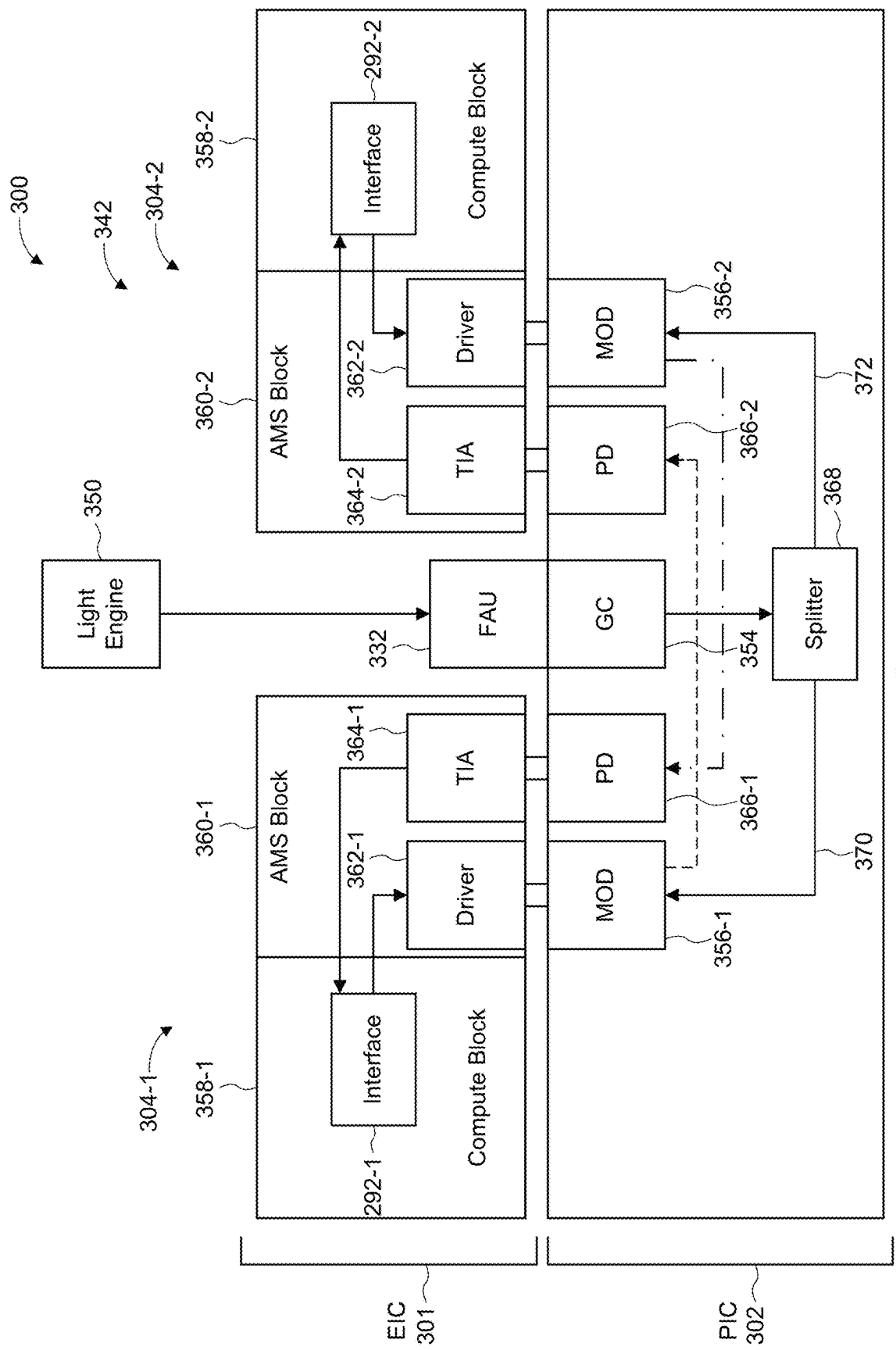
Figure 2:
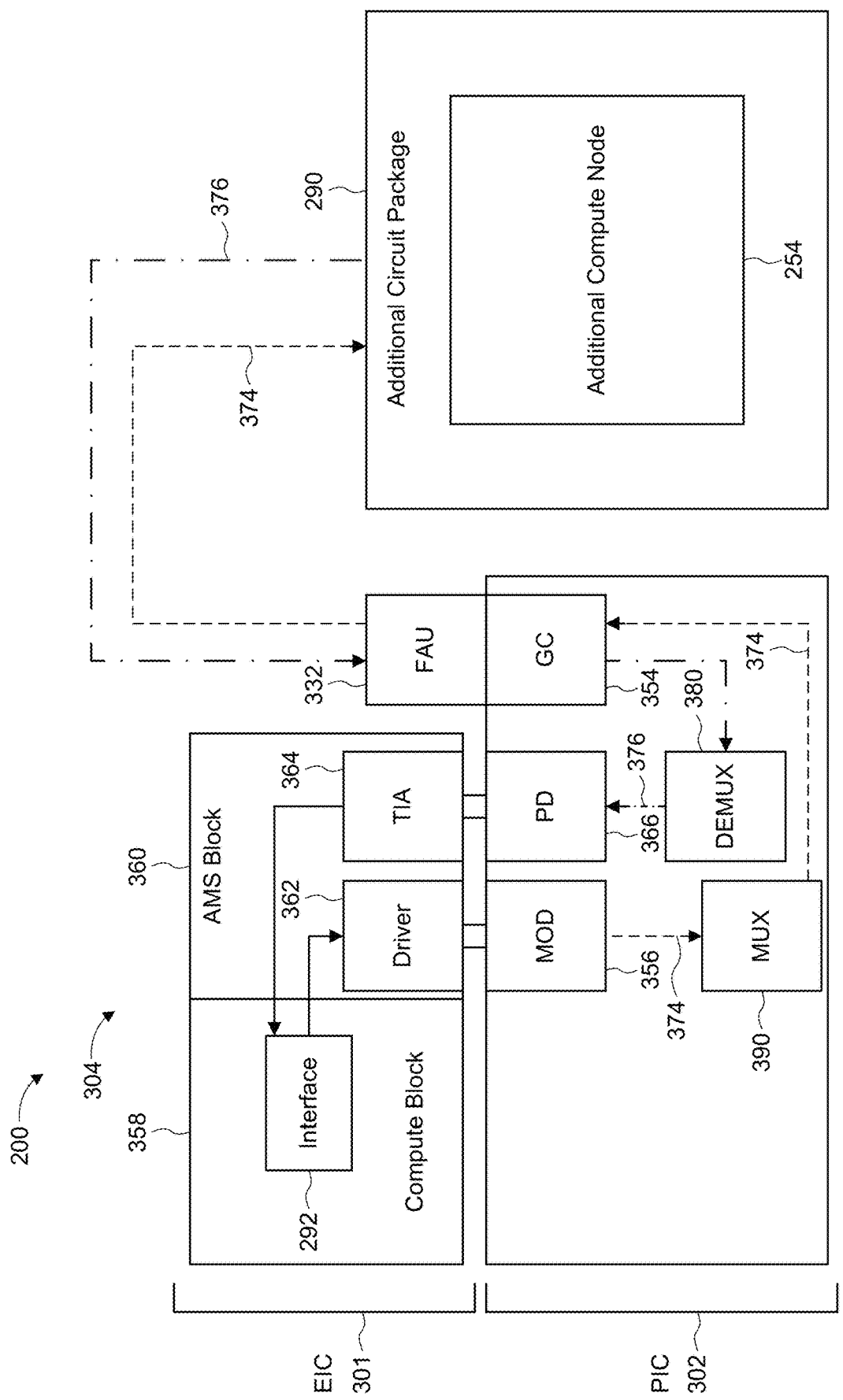
Figures 1, 3:
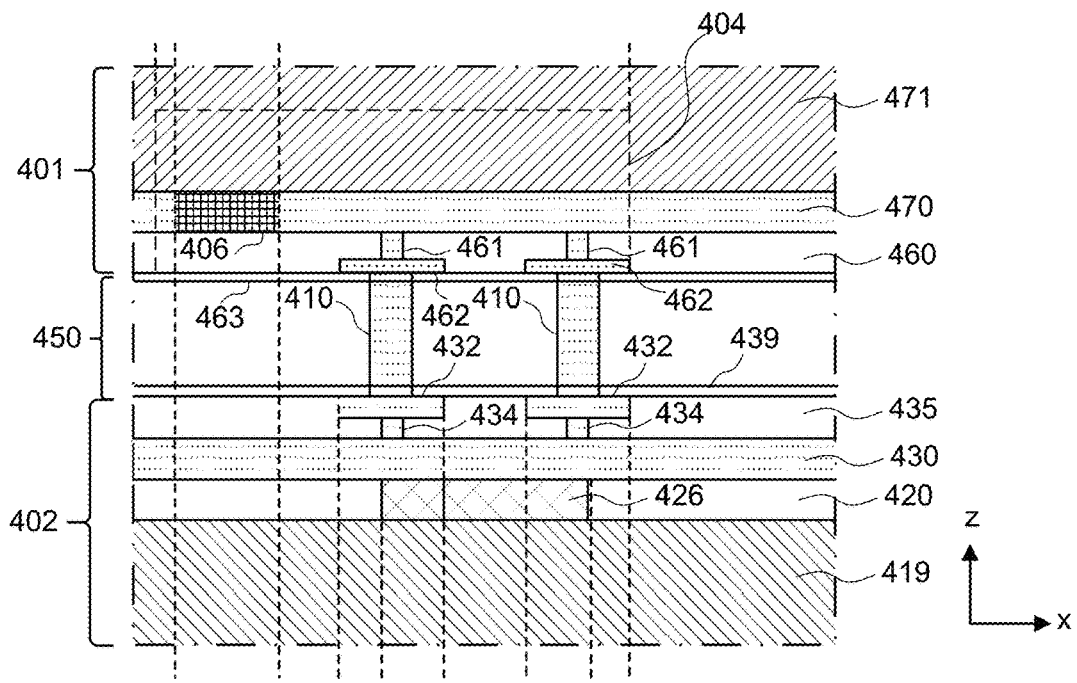
Figures 2, 3:
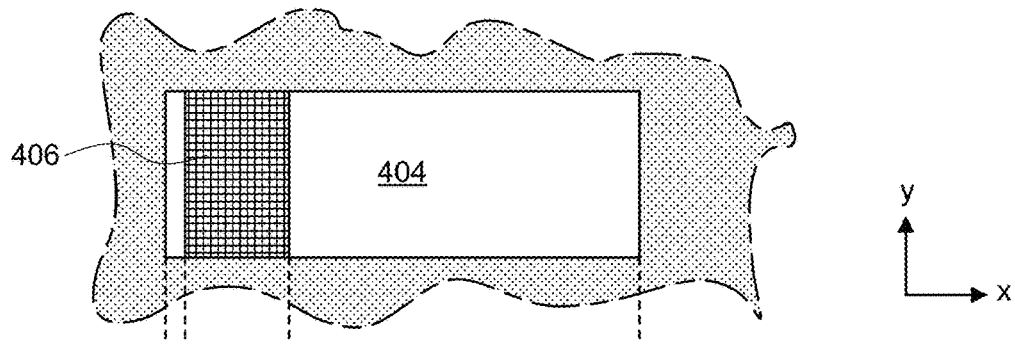
Figure 3:
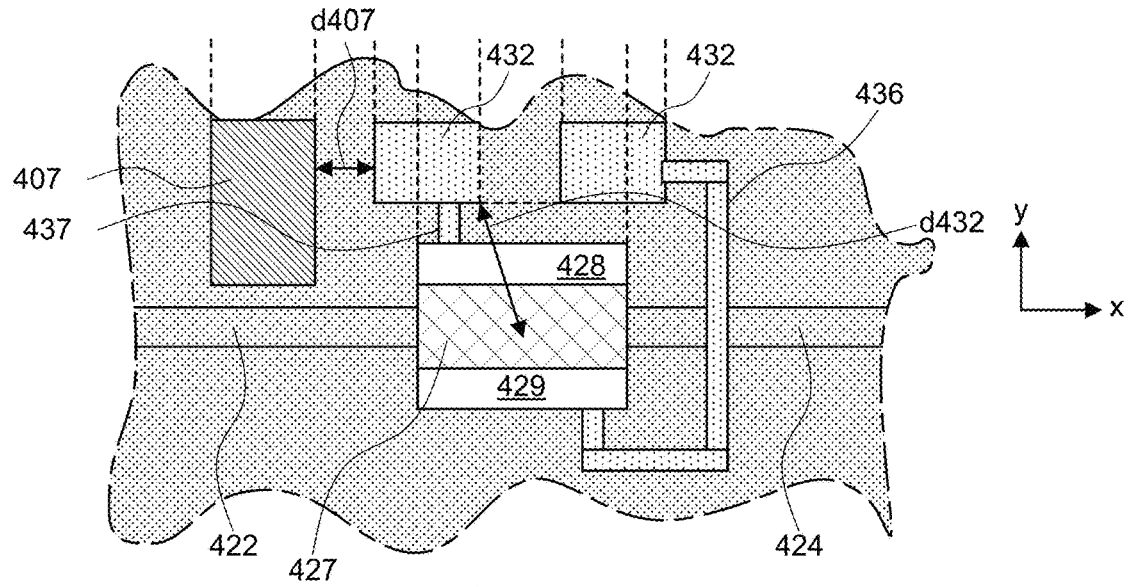
Figures 1, 4:
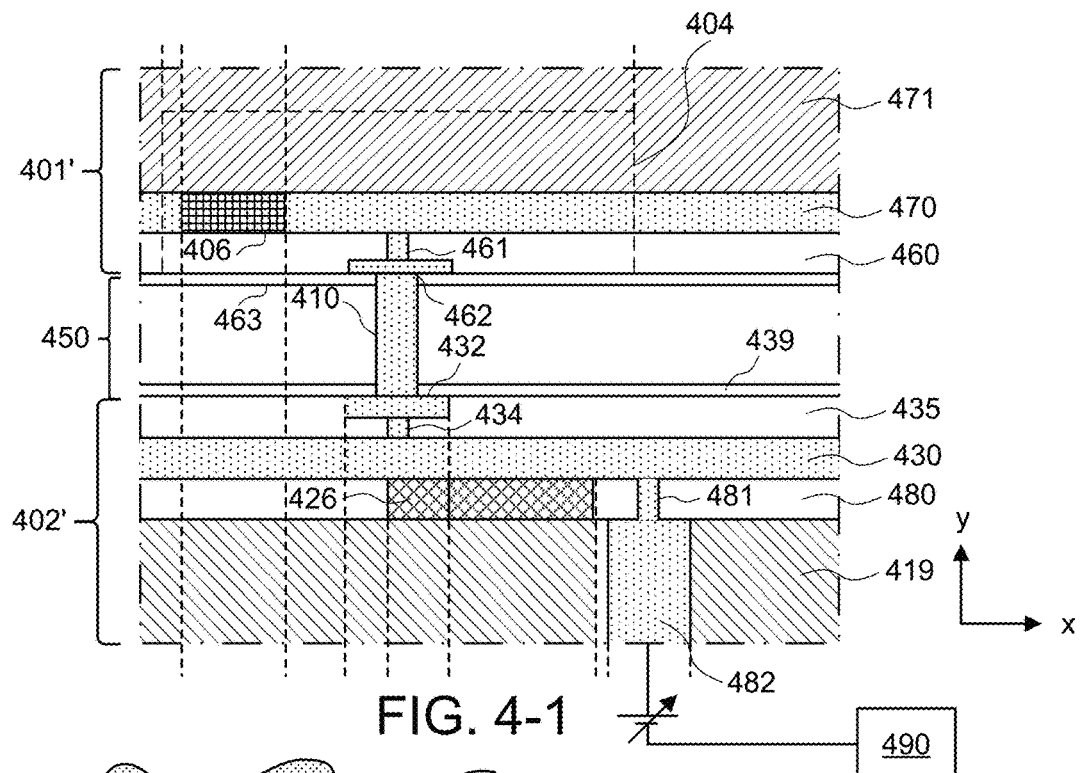
Figures 2, 4:
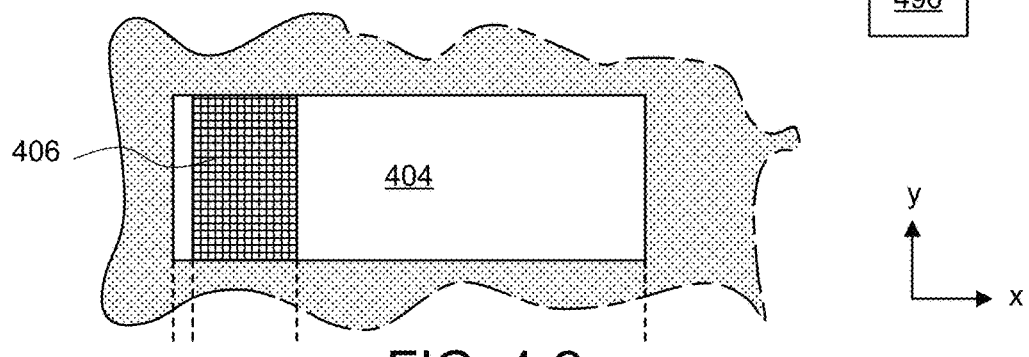
Figures 3, 4:
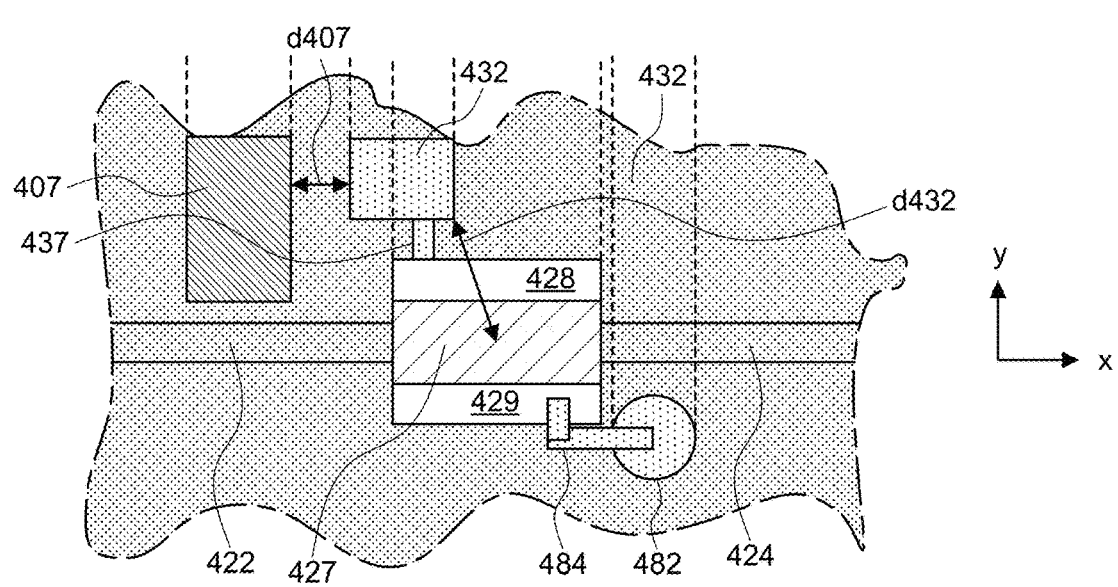

While the foregoing example features a PIC 402 with the EAM 426 with both electrodes electrically connected to the EIC 401, other configurations are possible. For example, FIGS. 4-1 to 4-3 show a similar example composed of an EIC 401' and a PIC 402' in which the cathode 428 is electrically connected to the EIC 401' via the copper pillar 410, but the anode 429 is electrically connected to a voltage source 490 by vias 481 and 482 (e.g., through silicon vias (TSV) and/or through dielectric vias (TDVs)). Electrically conducting portion 420 includes an electrically connection 484 which connects via 481 to the anode 429. The voltage source 490 can be an AC voltage source or a DC bias (e.g., grounded). In some examples, the voltage source 490 provides a DC bias offset that is varied based on changes in the temperature of the PIC 402'.

More generally, either of cathode 428 or anode 429 can be electrically connected to a voltage source that is separate from the AMS block 404, e.g., external to the EIC 401', while the other electrode is electrically connected to the driver in the EIC 401' via an electrical interconnect. Moreover, while FIG. 4-1 depicts a single TSV 482 and a single TDV 481, one or more layers in the PIC 402' can contain multiple vias that provide parallel electrical connections between layers.

Figures 1, 5:
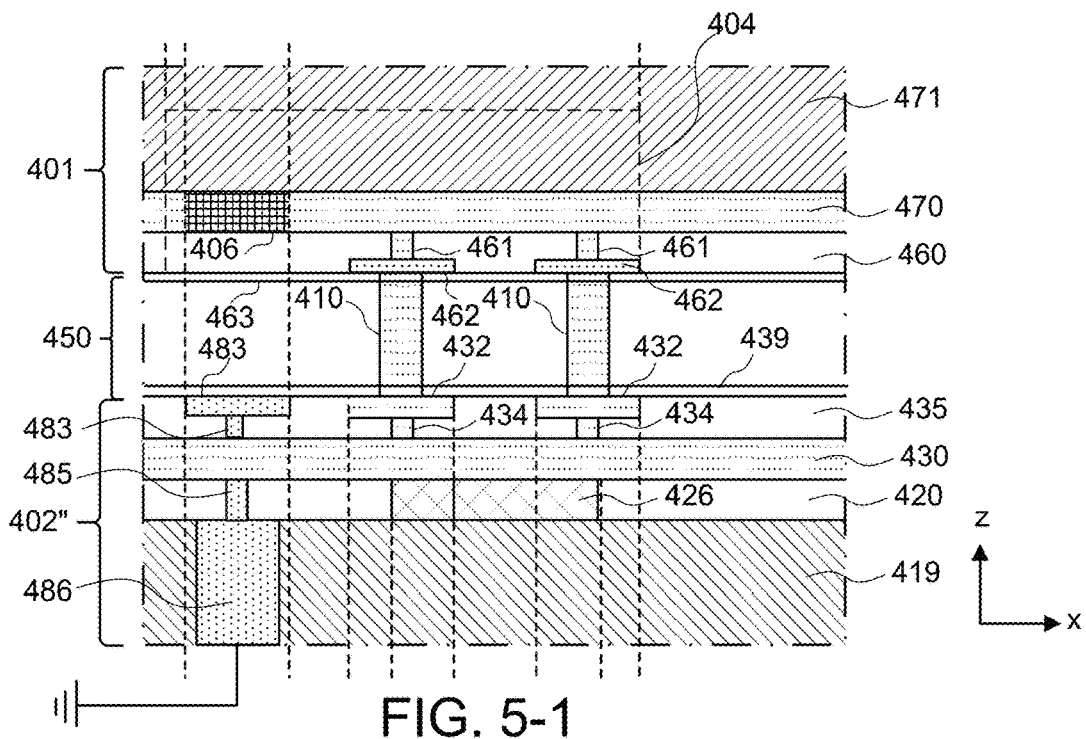
Figures 2, 5:
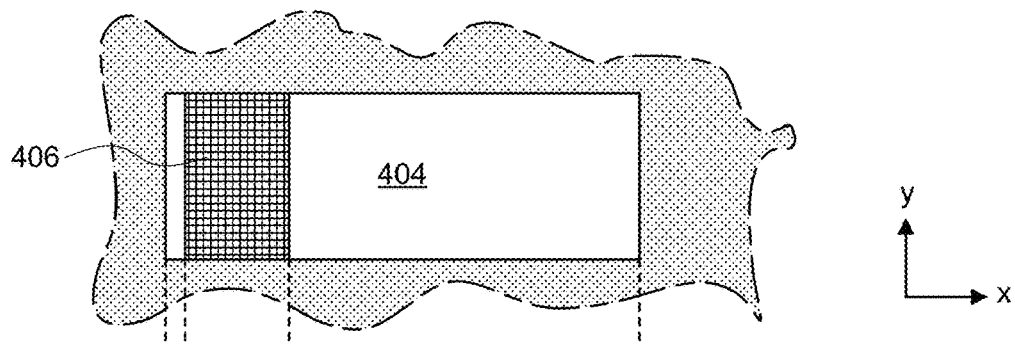
Figures 3, 5:
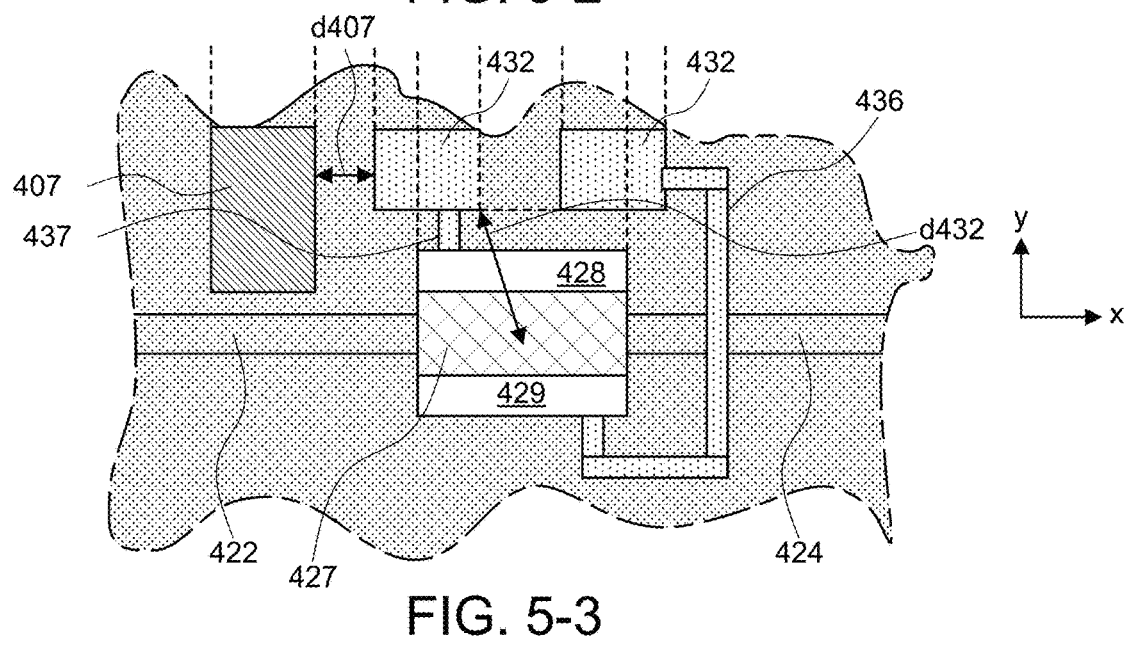

The examples described in FIGS. 3-1 through 4-3 feature the inductor 406 aligned with a region 407 free from electrical conductors, in some examples inductor 406 can instead be aligned with a grounded shield to reduce interference that may occur between the inductor and PIC. For example, referring to FIGS. 5-1 to 5-3, a PIC 402" includes a shielding plate 483 that is electrically grounded through the PIC through vias 485 and 486. The shielding plate 483 can be formed in the same metal layer as the electrical contacts 432 and extends over an area approximately the same as the area occupied by inductor 406 (e.g., slightly more than, the same as, or slightly less than the area of inductor 406). Shielding plates can, in general, be used with other electrical connection schemes, such as the scheme shown in FIGS. 4-1 to 4-3.

The shielding plate provides the inductor 406 with a known ground plane reference, which the inductor can be designed for. The ground plane shields the inductor from whatever may be going on with the PIC metallization beneath it.

Figures 1, 6:
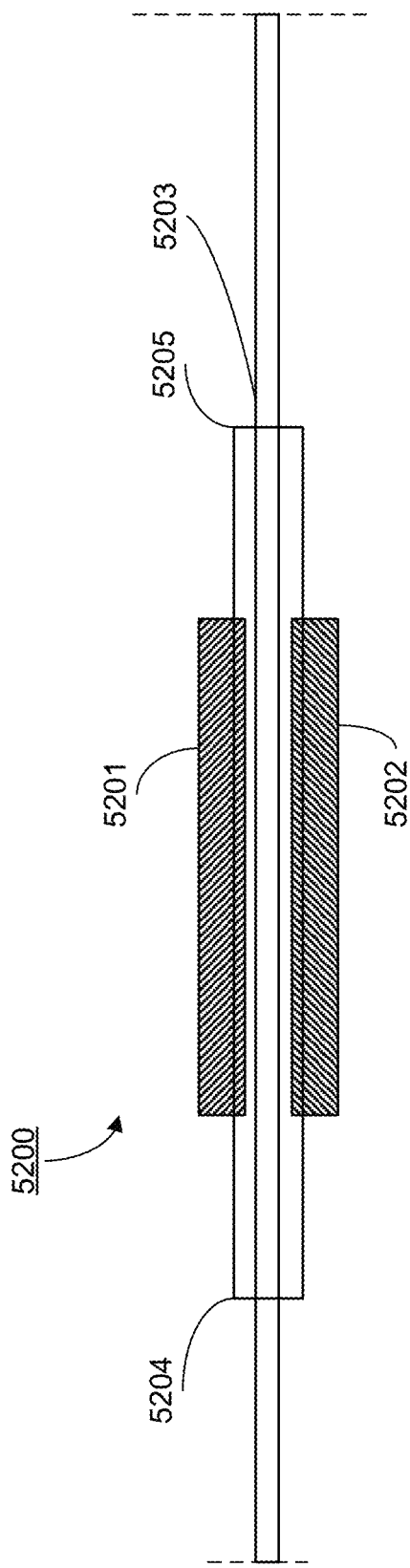
Figures 2, 6:
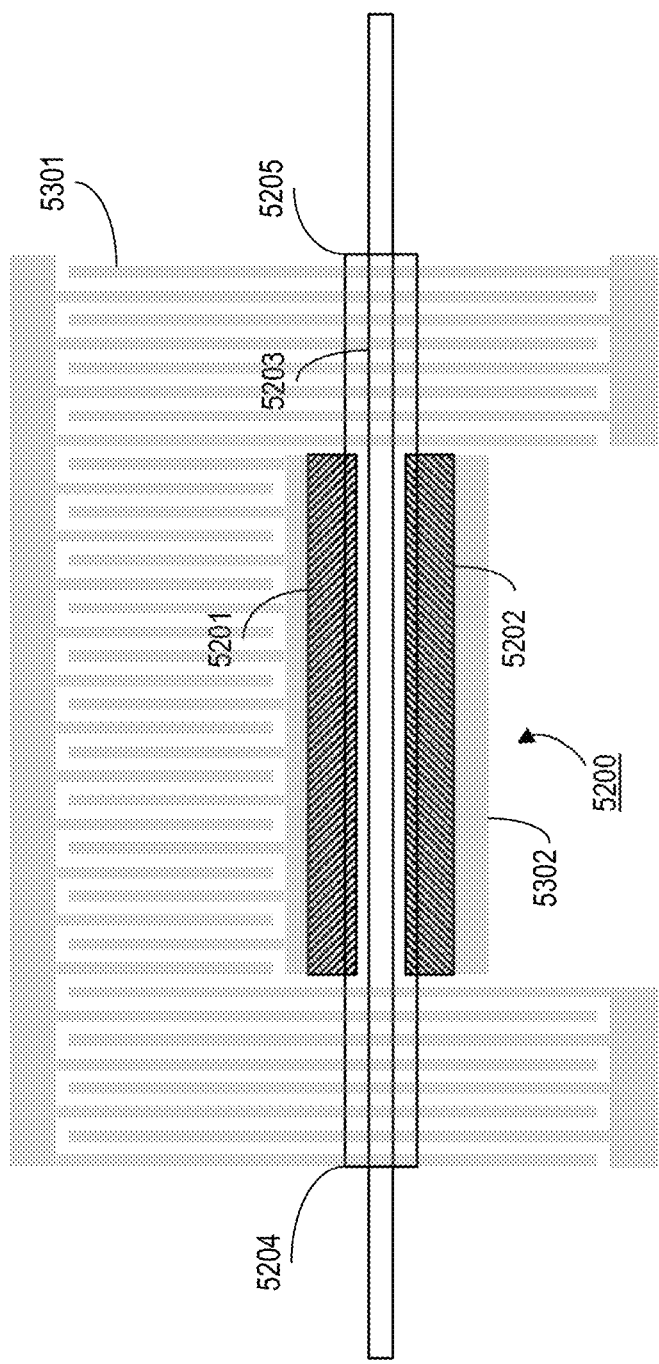
Figures 3, 6:
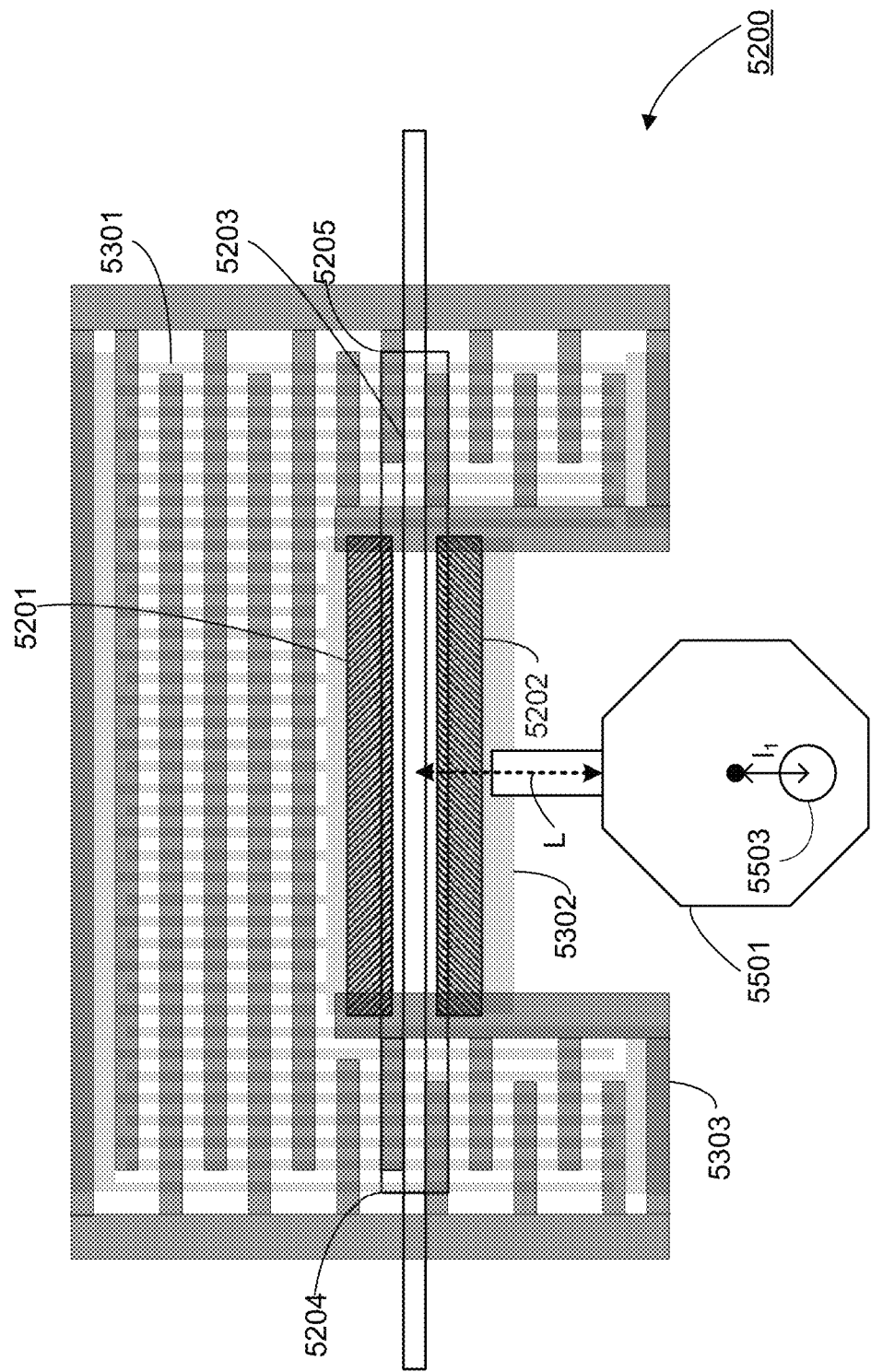

FIGS. 6-1 through 6-3 provide additional details of examples of an EIC 301 physically stacked on PIC 302 from the perspective of different layers in the process of semiconductor manufacturing, including features described above. FIG. 6-1 shows, in plan view, an example of an optical modulator 5200 inside a photonic integrated circuit (PIC). Here, FIG. 6-1 represents a physical layout of the optical modulator 5200, an EAM, to complement the logical diagrams of FIGS. 2-1 and 2-2 showing modulators 356-1 and 356-2. Here, optical modulator 5200 is composed of a diode junction and includes anode 5201, cathode 5202 on opposing sides of the junction. The junction overlaps an optical channel 5203 between anode 5201 and cathode 5202. The optical channel 5203 connects waveguides at an entry point 5204 and an exit point 5205. The optical modulator 5200 can be about 100 µm or less in length (e.g., about 50 µm). The diode can be formed from doped Germanium (e.g., GeSi, as described above). In some examples, diode includes a germanium layer on silicon on insulator (SOI).

During operation, incoming light in the waveguide enters the modulator from the entry point 5204, absorption of the light by the diode is subject to modulation by applying voltages through anode 5201 and cathode 5202 via the Franz-Keldysh effect. By driving the anode 5201 and cathode 5202 with a time-varying electrical signal, the light in the optical channel 5203 becomes modulated in accordance with the timing pattern of the driving electrical signal before leaving optical modulator 5200 at exit point 5205.

FIG. 6-2 shows more details of optical modulator 5200 of FIG. 6-1 including a patterned metal layer (e.g., Cu) where anode 5201 is connected to interdigitated decoupling filter 5301. Here, filter 5301 includes a bias trace routed down to, for example, a substrate on which the PIC is mounted. The filter 5301 provides sufficient capacitance to isolate optical modulator 5200 from potential electrical noise that may otherwise enter from anode 5201. As illustrated, the filter includes a metal-oxide-metal (MOM) capacitor (a MOMCAP). In some examples, metal-insulator-metal capacitors (MIMCAP), can be used instead or in additional to a MOMCAP capacitor.

FIG. 6-3 shows details of electrical coupling to the optical modulator 5200 of FIG. 6-2 where cathode 5202 is connected to landing pad 5501. The landing pad 5501 is generally sized in the sub-50 µm range laterally. In other words, the landing pad can be sized to have a maximum lateral dimension that is about 50 µm or less, e.g., 30 µm to about 40 µm. The landing pad 5501 has octagonal shape, however, other polygonal shapes, such as a hexagonal shape, may also be used. Additionally, or alternatively, the landing pad can also be shaped circularly or in an oval.

The landing pad 5501 is laterally displaced a distance L from the center of the modulator 5200. Generally, L depends on the specifics of the manufacturing process and PIC design, and can be relatively short, such as 1 µm to 10 µm (e.g., 5 µm to 8 µm).

FIG. 6-3 also shows a hole 5503 that corresponds to the location of the copper pillar that completes the electrical interconnect from the cathode 5202 and the EIC (not shown). Hole 5503 is offset by an amount $l_1$ from the center of the landing pad 5501. Generally, this offset can vary depending on the particular implementation. In some examples, the hole 5503 is centered on the landing pad. FIG. 6-3 also shows an additional layer 5303 of the decoupling filter of the electrical interconnect for the anode 5201.

Figures 1, 7:
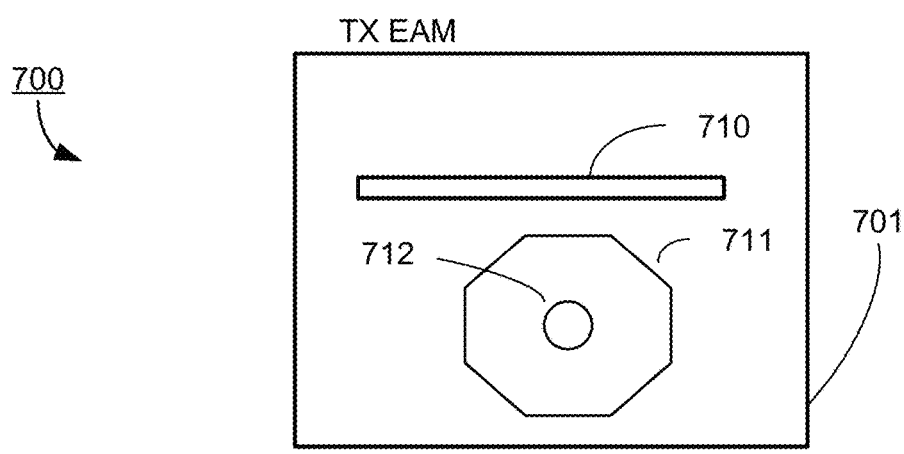
Figures 2, 7:
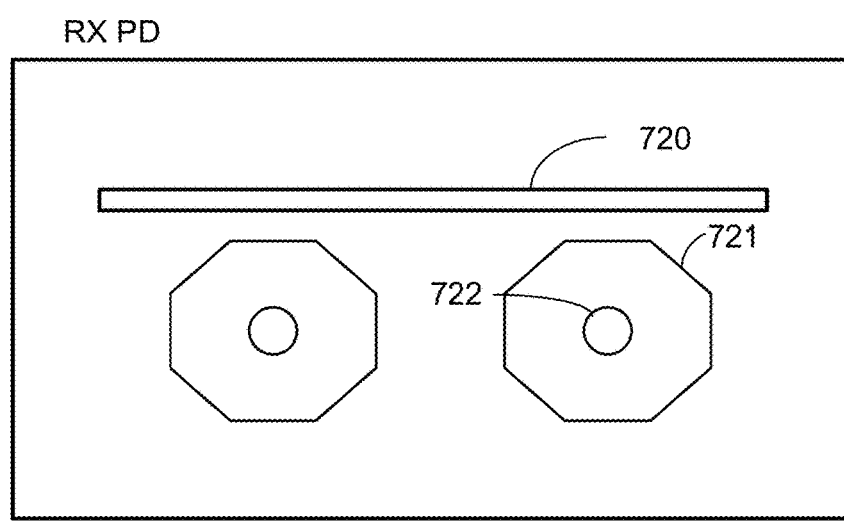
Figures 3, 7:
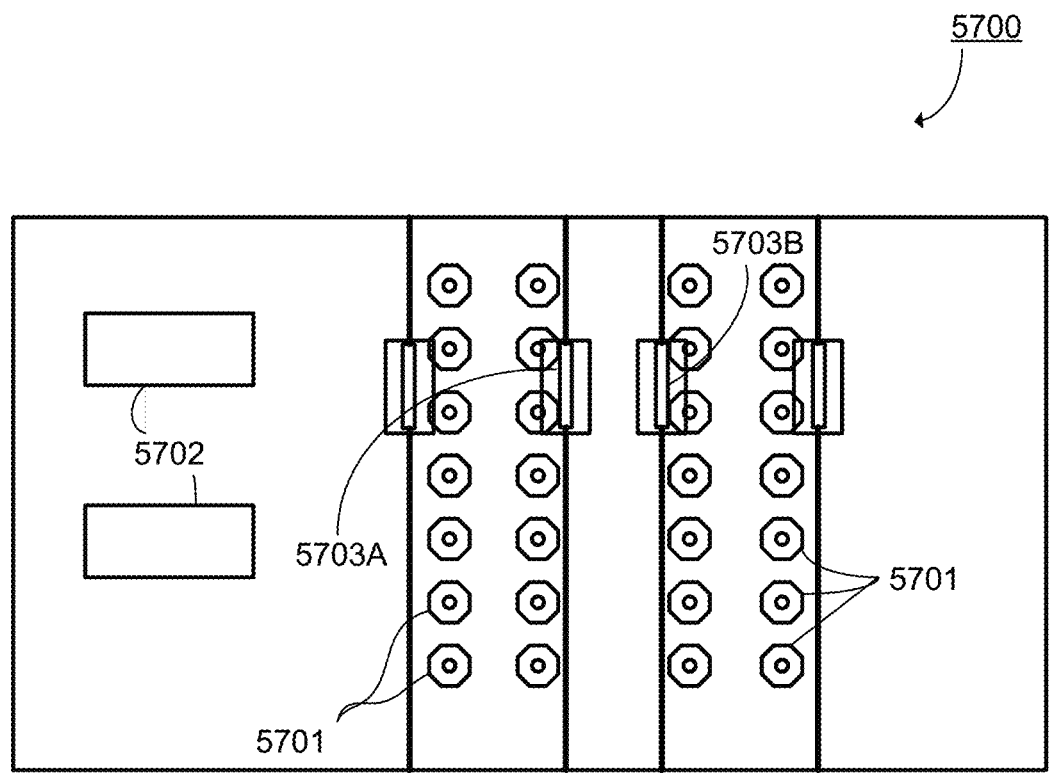

FIGS. 7-1 and 7-2 show further examples, in plan view, of portions of a PIC 700 that includes a bidirectional photonic link. Portion 701 in FIG. 7-1 corresponds to a portion of the transmission channel and includes a modulator 710. Portion 702 in FIG. 7-2 corresponds to a portion of the receiving channel and includes a photodiode 720. Holes 712 and 722 are provided in an oxide layer covering the metal layer (e.g., an aluminum layer) in which landing pads 711 and 721 are provided. 711 and plated in landing pad 711 for electrically connecting optical modulator 710 with a copper pillar. The holes 712 and 722 can be plated with one or more additional metal layers (e.g., Ni and/or Au). Copper pillars, which can be previously embedded in landing pads of an EIC, are aligned with and attached to the landing pads 711 and 721 through holes 712 and 722, respectively. Alternatively in some implementations, the copper pillars can be formed on the PIC before mating with corresponding holes opened in the oxide layer above the landing pad of the EIC.

During the hole opening process, surface oxide is partially removed to expose underlying aluminum. Thereafter, holes 712 and 722 may be plated with nickel and gold. Here, the opened holes may be about 10 µm in diameter laterally. The copper pillar can be sized 30 µm or less, for example, about 20 µm laterally. Because the copper pillar is sized larger than the hole 5601, no precise alignment is needed when mating.

Significantly, the plated hole is located at a center of the area occupied by the landing pad 711, which is sized in the sub-50 µm range laterally. The landing pad is offset from the modulator 710. Specifically, the modulator 710 is horizontally centered about the landing pad 711 and is vertically offset from the landing pad 711. In this example, the horizonal alignment provides close proximity for electrically connecting the driver on the EIC with the optical modulator on the PIC while the vertical offset prevents the landing pad from getting too close to portions of the modulator including, e.g., the germanium electro-optical channel in the modulator, the metallization on the cathode of the modulator, and the metallization of the anode of the modulator. Both the vertical and horizontal offsets, in this case from the condensed view, are about 6 µm when measured from the center of the modulator to the closest edge on the landing pad. In general, these offsets can be kept within a range of less than 10 µm. Such an offsets can reduce or minimize a parasitic capacitance when the landing pad is placed in proximity to the modulator. The offset can keep the parasitic capacitance below a pre-determined threshold level of tolerance. The pre-determined level of tolerance can be indicated by, for example, a modeling software and can be a threshold below which the driver can reliably drive the modulator the modulate light and encode information into the optical signal with sufficient fidelity for the application for which the package is used. In other words, the implementations can provide extraction of the parasitic capacitance created on the cathode side of the modulator. The implementations, however, are not limited to offsetting the landing pad on the EIC and the modulator on the PIC. Indeed, the implementations also pursue offsetting the landing pad on the EIC and the photodetector on the PIC in similar fashion to ease electrical routing while minimizing parasitic capacitance so that such capacitance can be reduced to a pre-determined threshold level of tolerance. In both cases, the separation between the active photonic component and the corresponding landing pad on the EIC is 2 mm or less (e.g., 1 mm or less, 500 µm or less, 200 µm or less, 100 µm or less, 50 µm or less). For example, the electrical interconnects provided by the copper pillars are no longer than 100 µm in length connecting the EIC to the PIC when measured from lower bound of the EIC to the upper bound of the PIC in the EIC-PIC stacked package shown in, e.g., FIGS. 2-1 and 2-2.

FIG. 7-3 shows another example of a photonic integrated circuit (PIC) 5700. PIC 5700 contains a multitude of landing pads 5701 for supporting electrical interconnections between PIC 5700 and an EIC stacked, for example, above PIC 5700, as discussed above in reference to FIGS. 1-4, 2-1 and 2-2. Consistent with the descriptions above in reference to FIGS. 3 through 7-2, landing pads 5701 are each sized with a lateral dimension that is less than about 50 µm, for example, between about 30 and about 40 µm.

As illustrated in FIG. 7-3, optical modulators 5703A and 5703B are positioned in proximity to corresponding landing pads on the PIC. Consistent with the descriptions above in reference to FIGS. 3 through 7-2, the landing pads on the PIC have plated holes for mating with copper pillars protruding from landing pads on the EIC stacked above. The offset between the landing pads and optical modulators can prevent parasitic capacitance from exceeding a pre-determined threshold level. Examples of offset configurations have been provided above.

FIG. 7-3 also illustrates an uneven distribution of landing pads 5701. Specifically, landing pads 5701 are arranged in 2-dimensional (2D) pattern in which spacings between two direct neighbors of landing pads need not be uniform. In other words, some directly neighboring landing pads can be separated by a gap shorter than other directly neighboring landing pads. Thus, landing pads 5701 are not necessarily uniformly spaced in the 2D pattern. Moreover, in the 2D pattern, landing pads 5701 need not be located on a regular 2D grid with nodes evenly spaced in row and column directions. Such positioning arrangement is generally physically related to the positioning of AMS blocks on the EIC stacked above. As described above in reference to FIG. 2-1, AMS blocks 360 each include a modulator driver 362-1 and 362-2, collectively, drivers 362, and each include a transimpedance amplifier 364-1 and 364-2, collectively, TIAs 264. For efficient routing, the landing pads on the PIC are generally positioned to align with the locations of AMS blocks on the EIC such that the AMS are generally vertically above the landing pads. Because of physical constraints, such as irregular shapes or contours, the center of a landing pad on the PIC and the center of a corresponding AMS block can still be offset by an amount that is generally a fraction of the lateral dimensional size of the landing pad or the AMS block.

FIG. 7-3 further illustrates vacant areas 5702 where no landing pads are provided. The vacant areas are provided to accommodate vertically stacking of an EIC that includes inductive components, e.g., spiral inductors for a phase-locked loop to generate a clock signal, e.g., a local clock. Other configurations can be used as well, such as a figure-8 shaped inductor. As noted above, the inductor creates local magnetic fluxes when activated, which may impact the operation of nearby components. Moreover, when metalized components are nearby the inductor, unintended mutual inductance can be created that hinder the operation of, for example, the EIC-PIC stacked package. For these reasons, a landing pad is not provided in the surrounding area of the inductor on other layers of the EIC, or on the PIC, and no copper pillar is planned for this area in the EIC-PIC stacked package. The bottom panel of FIG. 7-3 shows a vacant area on another layer in the EIC-PIC stacked package. Alternatively, as described previously, inductive components in the EIC can be shielded by a grounded conductive shield rather than a vacant area.

Figure 8:
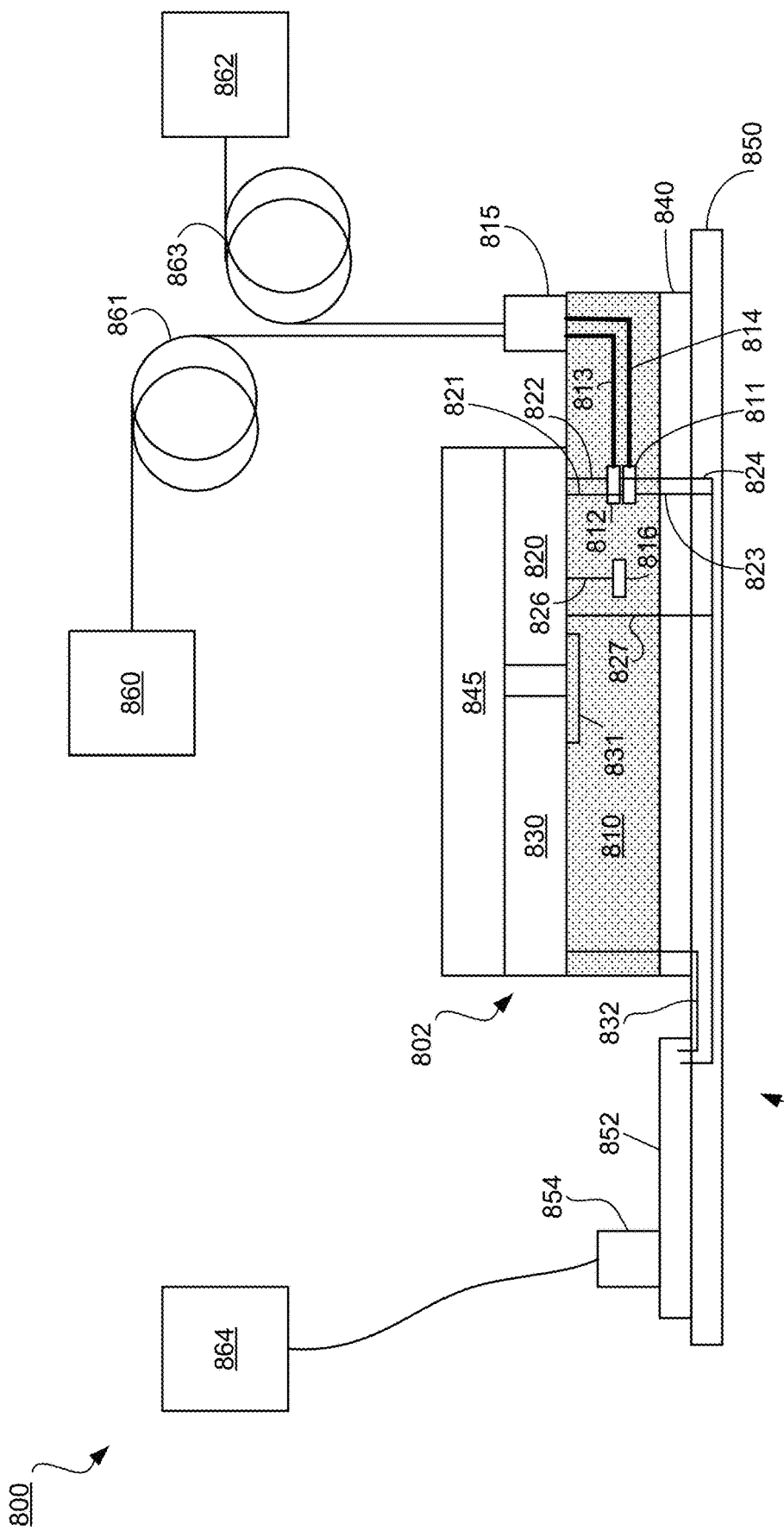
FIG. 8 is a schematic diagram showing an example of a computer system including a circuit board including a package including a PIC including bidirectional photonic links and electrical interconnects to an EIC.

As noted previously, the circuit packages described above can be implemented in a variety of larger computer systems to provide photonic links between different components. Referring to FIG. 8, an example of such a computer system is computer system 800 which includes a processor device 801 connected to a light source 860, a memory device 862, and an external power source 864.

The processor device 801 includes a circuit package 802, a power controller 852, and a circuit board 850. The circuit package 802 includes a substrate 840, a PIC interposer 810, an EIC 820, a processor 830, and a heat sink 845. The EIC 820 contains one or more AMS blocks as described previously and is mounted on a surface of the PIC interposer 810, e.g., as described previously. The processor 830 is mounted on the same surface of the PIC interposer 810 as the EIC 820 and is electrically connected to the EIC 820 via an electrical interconnect 831 that is routed through the PIC interposer 810. While a single electrical interconnect 831 is illustrated, the package 802 can include many separate electrical interconnects between the processor 830 and the EIC 820. The heat sink 845 is mounted on the surfaces of the processor 830 and the EIC 820 opposite the PIC interposer 810 and facilitates thermal management of the processor and EIC during operation.

The circuit package 802 is connected to the light source 860 and memory card 862 via fiber bundles 861 and 863, respectively, which are attached to a surface of the PIC via a fiber array unit 815. The power source 864 is attached to the power controller 854 via a cable that connects at connector 854. An electrical interconnect 832 routes electrical power from the controller 854 to the processor 830 through the substrate 840 and the PIC interposer 810. Another electrical interconnect 827 routes electrical power from the controller 852 to the EIC 820 through the substrate 840 and the PIC interposer 810. While a single electrical interconnect 827 is illustrated, the processor device 801 can include many separate electrical interconnects between the circuit package 802 and the power controller 852, and/or between the circuit package 802 and other components of the processor device 801 not illustrated.

The PIC interposer 810 includes an EAM 811 and a photodiode 812 which are connected to the fiber array unit 815 via waveguides 813 and 814, respectively. One electrode of the EAM 811 and one electrode of the photodiode 812 are connected, via electrical interconnects 821 and 822, respectively, to the AMS block in the EIC 820. The other electrode of each component is connected, via electrical interconnects 823 and 824, respectively, via the substrate 840 and PCB 850 to the power controller 852.

The AMS block in the EIC 820, the EAM 811, and the photodiode 812 are components of a bidirectional photonic link between the processor card 801 and the memory device 860. The light source 862 supplies optical signals to the circuit package 802, which modulates optical signals which are then routed via the bidirectional link to the memory device 860. Further, the circuit package 802 receives data via optical signals from the memory device 860.

The PIC interposer 810 also includes a temperature sensor 816 that is electrically connected to the EIC 820 via an electrical interconnect 826. Based on the measured temperature in the PIC interposer, the EIC 820 adjusts the bias voltage of the EAM 811 and/or the photodiode 812 to ensure that performance of the EAM and/or photodiode remain within an established operational threshold despite temperature fluctuations in the PIC interposer, e.g., due to varying data loads between the processor device 801 and the memory device 860.

While the electrical interconnect 821 between the AMS block and the EAM 811 and the electrical interconnect 823 between the EAM 811 and the power controller 852 in circuit package 802 are similar to those illustrated in FIGS. 4-1 to 4-3, described above, more generally any of the electrical interconnect schemes described herein can be applied to the circuit package. Moreover, in general, either or both of the electrodes of either or both of the EAM 811 and photodiode 812 can be routed to the EIC 820 rather than one of the electrodes being routed through the opposite side of the PIC interposer and the substrate.

In general, while system 800 illustrates a single bidirectional photonic link, more generally, circuit packages can include several bidirectional photonic links, each connected to a different package and/or to another integrated circuit that is part of the same package. In some examples, a circuit package can include four, eight, 16, 32, or more bidirectional photonic links.

While the temperature sensor 816 is located in PIC 810, more generally, the temperature of the PIC interposer 810 can be monitored via temperature sensors located elsewhere in the package, such as in the substrate 840 or mounted elsewhere on the processor card 801.

The described compute and memory nodes and fabric of communication links including the modulators and electrical interconnects described above provide a distributed data processing environment, which may be referred to as a fabric-based environment, on which programs can be run. A compute node or memory node in such an environment will generally have installed on it a software stack that runs on one or more processors of the node to provide an operating environment, which may be referred to as a layer, on which program software deployed to the node can run.

The compute and memory nodes of a particular environment can be homogeneous, i.e., all the compute nodes are basically the same and all the memory nodes are basically the same, or they can be heterogeneous.

A compute node has one or more processors that can perform data processing operations, e.g., by executing program instructions, by performing operations implemented in hardware or firmware, by routing a data packet through the electrical interface, or otherwise. The processors can include, for example, CPUs, accelerators of various kinds, e.g., GPUs (graphics processing units), TPUs (tensor processing units), DPUs (data processing units), or programmed FPGAs (field-programmable gate arrays) or other special purpose ASICs (application specific integrated circuits), or by a combination of two or more of them.

A compute node generally has or is directly connected electrically to local memory, e.g., HBM, DDR, L1 and L2 caches, registers and the like.

A memory node, while it may have processors to run software and may have other characteristics of a compute node, has as its primary purpose in a fabric-based environment the purpose of providing access to data, specifically, for example, for use by compute processes running on compute nodes, and to enable other nodes to read and write data over photonic channels connecting the memory node to the other nodes. The memory devices a memory node has for storing data can be of one or more types. They are connected through respective memory controllers, message routers, and photonic interfaces through which other nodes read and write data by sending messages to ports implemented on the memory node.

Compute and memory nodes can have memory devices of one or more kinds, including, for example, flash memory, read-only memory, random-access memory (RAM), static RAM, dynamic RAM (DRAM), synchronous DRAM (SDRAM), double data rate (DDR) based DRAM, or high bandwidth memory (HBM) memory, or a combination of two or more of them.

Unidirectional photonic links have a photonic transmitter at one end and a photonic receiver at the other end linked by an optical waveguide, e.g., a semiconductor waveguide or an optical fiber.

Generally, a photonic channel used in a fabric-based environment is a bidirectional photonic channel, which has at least two unidirectional photonic links that transmit in opposite directions, providing, for example, for the transmission of messages in one direction and acknowledgements in the other.

In some implementations, the nodes of a fabric-based environment include routers to route data from one node, directly or through intermediary nodes, to another. Generally, data is transferred in messages over photonic or electrical channels in response to programs executing on the nodes or to operations of memory controllers or similar devices, for example. Such messages can be sent point-to-point, when the two nodes have links directly connect them, or through routers on one or more intermediary nodes that route messages according to addressing data that is part of the messages.

In some implementations, a compute node will have multiple ports, electrical or photonic or both, each directly connected by a link or channel, e.g., bidirectional channel, to a respective other node; and the messages sent by the compute node will be routed to the messages' target nodes by a router on the compute node that directs the messages to the appropriate port on the compute node. When a data message is received over a port, the router on the receiving node will examine the message header to determine the destination node in the fabric, either the node itself or another node, and process the message accordingly.

The addressing of messages through the fabric-based environment can be implemented in a variety of ways. In some implementations, multiple methods are implemented in the same fabric-based environment. In some addressing methods, messages carry the actual address of the message destination, and routers in the fabric implement what in effect are routing tables to transmit messages toward their destination addresses. In some implementations, the routing tables are updated dynamically in response to information about device failures or losses of connections, for example. In other addressing methods, messages are routed by relative addresses, i.e., addresses expressed as directional steps from the current node. Modeling nodes as points on a 2D, 3D, or higher dimensional grid, a target destination can be represented in a message header as a number of steps, which may be positive, negative, or zero, in each of the dimensions. When a message has been transmitted, the receiving node can update the message header of the message to account for the steps taken by the message from the sender in each dimension, with the result that the message header now contains a relative address relative to the receiving node. In other addressing methods, a combination of direct and relative addresses is used.

Memory nodes can be interconnected by photonic links, e.g., in the form of bidirectional photonic channels, to form a memory fabric. The memory fabric can be part of a server and generally includes multiple nodes in one or more packages. A package can include hundreds of nodes extending in multiple dimensions. A fabric made up of multiple packages can have hundreds of thousands of nodes or more, connected by photonic channels in a 2D, 3D, or higher dimensional memory fabric when the nodes have a sufficient number of photonic ports.

Generally, a fabric-based environment is implemented using packages of nodes. A package, sometimes called a System in Package (SiP), includes multiple nodes that are interconnected potentially both at an electrical layer of the package and on an interconnection substrate, e.g., a PIC, and which can be enclosed in a single casing. Each of the nodes in a package can have electrical connections, photonic connections, or both to other nodes within the package. Connections within a package are referred to as intra-chip connections, with the substrate being considered a chip. Connections between nodes in different packages are referred to as inter-chip connections.

In an environment with multiple packages, some, or all of the nodes in one package have inter-chip photonic connections to nodes in one or more other packages. Generally, these inter-chip photonic connections are made by bidirectional photonic channels.

Generally, a program that runs on a fabric-based environment will be made up of program modules, each constructed to run on one of the nodes of the environment. Generally, each module includes instructions to invoke the services of the software stack on which it is running or of the underlying physical devices of the node, to load and store data, locally or remotely, to perform computing and control operations, and to communicate and coordinate with other modules of the program running on the same node or on other nodes on which the program has also been deployed.

Each of the one or more modules that make up a program can be coded separately for a respective particular kind of node. Or a large program can be broken up automatically, e.g., by a compiler, into separately deployable components to run on the nodes of a fabric-based environment. The environment and the resources available in its nodes and the characteristics of its connections, are described by a physical topology, to define, for example, the target for which the compiler is generating executable code.

A program or the modules of a program can generally be programmed using any suitable procedural, interpreted, or declarative language, or combinations of them, from which executable or interpretable code is automatically generated, e.g., by a compiler, to run on some run-time environment, for example, on some node hardware or some software layer or layers installed on the hardware.

A physical topology generally describes the locations of the nodes, any intra-chip connections, and inter-chip connections each node has to other nodes. In some fabric-based environments, nodes are implemented in packages, and the location of a node may also include the package in which it is found. A physical topology may be stored in a topology file that defines an environment for a compiler or for deployment management software.

Program modules and components of the software stack will generally be deployed to nodes through electrical links from a control computer, which may be one of the nodes of the fabric-based environment programmed to perform this function, or which may be a separate control computer. These links can be direct or indirect, and may be provided by an electrical bus, e.g., a PCIe (Peripheral Component Interconnect Express) bus. In some implementations, the photonic links of the fabric-based environment may also be used to deploy modules and components to nodes.

Executable code can be deployed to nodes directly, or, for example, in containers which can be managed by a container management or orchestration system.

A fabric-based environment will generally include one or more nodes that are connected, or can be connected dynamically, to devices external to the fabric. External devices can include devices, for example, to provide human interaction for programs running on the fabric, or to provide data to, or to receive results from, such programs.

The fabric-based environment can be or be part of a general computing environment for executing programs. The computing environment can include or be associated with a compilation environment. The compilation environment takes a program input, e.g., an input machine learning model, and transforms it into machine-readable form by executing a compiler and a code generator. An input machine learning model can be provided in the form of a TensorFlow model, for example.

The application code generated by the compiler and code generator is, in some implementations, provided to a runtime environment running on the nodes of the computing environment. The runtime environment provides services to the running application code on the computing environment. In some implementations, the nodes of the computing environment include firmware that performs hardware-related operations, e.g., monitoring and driving hardware components of the computing environment, used by the runtime environment and the application code.

The application and runtime environment run on the compute nodes and use, if and as requested by the application, the resources of the fabric-based environment, including, for example, the compute nodes, memory nodes, memory devices, links and channels, routers, and ports.

As discussed herein in detail, the present disclosure includes a number of practical applications having features described herein that provide benefits and/or solve problems associated with providing a multi-node computing system with sufficient memory, processing, bandwidth, and energy efficiency constraints for effective operation of AI and/or ML models. Some example benefits are discussed herein in connection with various features and functionalities provided by the computing system as described.

For example, the various circuit packages described herein and connections thereof may enable the construction of complex topologies of compute and memory nodes that can best serve a specific application. In a simple example, a set of photonic channels connect memory circuit packages with memory nodes (e.g., memory resources) to one or more compute circuit packages with compute nodes. The compute circuit packages and memory circuit packages can be connected and configured in any number of network topologies which may be facilitated through the use of one or more photonic channels include optical fibers. This may provide the benefit of relieving distance constraints between nodes (compute and/or memory) and, for example, the memory circuit packages can physically be placed arbitrarily far from the compute circuit packages (within the optical budget of the photonic channels).

The various network topologies may provide significant speed and energy savings. For example, photonic transport of data is typically more efficient than an equivalent high-bandwidth electrical interconnect in an EIC of the circuit package itself. By implementing one or more photonic channels, the electrical cost of transmitting data may be significantly reduced. Additionally, photonic channels are typically much faster than electrical interconnects, and thus the use of photonic channels permits the grouping and topology configurations of memory and compute circuit packages that best serve the bandwidth and connectivity needs of a given application. Indeed, the architectural split of memory and compute networks allows each to be optimized for the magnitude of data, traffic patterns, and bandwidth of each network applications. A further added benefit is that of being able to control the power density of the system by spacing memory and compute circuit packages to optimize cooling efficiency, as the distances and arrangements are not dictated by electrical interfaces.

This specification uses the term "configured to" in connection with systems, apparatus, and computer program components. That a system is configured to perform particular operations or actions means that the system has installed on it software, firmware, hardware, or a combination of them that in operation cause the system to perform the operations or actions. That one or more computer programs is configured to perform particular operations or actions means that the one or more programs include instructions that, when executed, perform the operations or actions. That special-purpose circuitry is configured to perform particular operations or actions means that the circuitry circuit elements that, when put into operation, perform the operations or actions.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one example" or "an example" of the present disclosure are not intended to be interpreted as excluding the existence of additional examples that also incorporate the recited features. For example, any element described in relation to an example herein may be combinable with any element of any other example described herein. Numbers, percentages, ratios, or other values stated herein are intended to include that value, and also other values that are "about" or "approximately" the stated value, as would be appreciated by one of ordinary skill in the art encompassed by examples of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to examples disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the examples that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The following numbered paragraphs are non-limiting examples of various embodiments of the present disclosure.

A1. A system-in-package including: a photonic integrated circuit (PIC) including an electro-absorption modulator (EAM) electrically connected to a first landing pad at a surface of the PIC; and an electronic integrated circuit (EIC) stacked on the surface of the PIC, the EIC including an electrical component electrically connected to a second landing pad at a surface of the EIC facing the surface of the PIC; a copper pillar physically connecting the first landing pad to the second landing pad, wherein the first landing pad, the copper pillar, and the second landing pad provide at least a portion of an electrical interconnect between the EAM and the electrical component, and when viewed from the EIC towards the PIC, the EAM of the PIC is offset from the first landing pad.

A2. The system-in-package of paragraph A1, wherein the offset is sufficient to keep a parasitic capacitance between the landing pad and the EAM within a pre-determined threshold level of tolerance.

A3. The system-in-package of paragraph A1, wherein the EAM includes a cathode and an anode, and wherein the electrical component is a driver of the EAM.

A4. The system-in-package of paragraph A3, wherein the copper pillar is electrically connected to the cathode of the EAM.

A5. The system-in-package of paragraph A3, further including a substrate (e.g., glass, silicon, plastic) supporting the PIC, and wherein the anode of the EAM is electrically connected to a bias trace routed to the substrate.

A6. The system-in-package of paragraph A3, wherein, when viewed from the EIC towards the PIC, a center of the EAM is offset from a nearest edge of the first landing pad by about a distance in a range from 1 μm to 10 μm.

A7. The system-in-package of paragraph A6, wherein the distance is in a range from 5 μm and 8 μm.

A8. The system-in-package of paragraph A3, wherein the EAM is about 100 μm or less in length from an input optical port to an output optical port.

A9. The system-in-package of paragraph A2, wherein the copper pillar has a lateral dimension of 30 μm or less.

A10. The system-in-package of paragraph A9, wherein the first landing pad is shaped as a polygon or a circle.

A11. The system-in-package of paragraph A10, wherein the copper pillar contacts the first landing pad at a center of the polygon or the circle.

A12. The system-in-package of paragraph A10, wherein the copper pillar contacts the first landing pad away from the center of the polygon or the circle.

A13. The system-in-package of paragraph A9, wherein the first landing pad has a maximum lateral dimension of 50 μm or less.

A14. The system-in-package of paragraph A3, wherein, the driver and the modulator are spaced apart by about 2 mm or less.

A15. The system-in-package of paragraph A3, wherein the PIC further includes a photodiode and the EIC further includes a trans-impedance amplifier electrically connected to the photodiode via a second electrical interconnect including a second copper pillar between the PIC and the EIC, the modulator and the photodiode being components of a bidirectional photonic link in the PIC.

A16. The system-in-package of paragraph A15, wherein the bidirectional photonic link includes a first waveguide connecting the modulator to a fiber array unit and a second waveguide connecting the photodiode to the fiber array unit.

A17. The system-in-package of paragraph A15, wherein the electrical interconnects each have a length of 100 μm or less.

A18. A method for providing a system-in-package including a photonic integrated circuit (PIC) and an electronic integrated circuit (EIC), the PIC including an electro-absorption modulator (EAM) electrically connected to a first landing pad at a surface of the PIC, the EIC including an electrical component electrically connected to a second landing pad at a surface of the EIC, the method including: providing a copper pillar in the EIC contacting the second landing pad, the copper pillar protruding from the EIC; and attaching a protruding portion of the copper pillar to the first landing pad to provide an electrical interconnect between the EAM and the electrical component while stacking the EIC on the PIC such that, when viewed from the EIC towards the PIC, the EAM of the PIC is offset from the first landing pad.

A19. The method paragraph A18, wherein the EAM on the PIC is offset from the first landing pad by an amount sufficient amount to keep a parasitic capacitance between the landing pad and the active photonic component within a pre-determined threshold level of tolerance.

A20. The method of paragraph A18, wherein providing the copper pillar in the EIC includes forming an opening in a layer of an oxide material coating the landing pad and forming the copper pillar to protrude from the layer of the oxide material.

A21. The method of paragraph A20, wherein attaching the protruding portion of the copper pillar to the first landing pad includes forming an opening in a layer of an oxide material on the PIC to expose the first landing pad and contacting the copper pillar to the first landing pad.

A22. The method of paragraph A18, wherein the first and/or second landing pads include aluminum.

A23. The method of paragraph A22, wherein the first and/or second landing pads are plated with nickel and/or gold.

A24. A system-in-package including: a photonic integrated circuit (PIC) including an electro-absorption modulator (EAM) electrically connected to a first landing pad at a surface of the PIC; an electronic integrated circuit (EIC) stacked on the surface of the PIC, the EIC including an electrical component electrically connected to a second landing pad at a surface of the EIC facing the surface of the PIC; and a copper pillar physically connecting the first landing pad to the second landing pad, wherein the first landing pad, the copper pillar, and the second landing pad provide at least a portion of an electrical interconnect between the EAM and the electrical component, and when viewed from the EIC towards the PIC, the EAM of the PIC is offset from the second landing pad of the EIC.

B1. A system-in-package including: a photonic integrated circuit (PIC) including an active photonic component and one or more patterned electrically conducting layers between the active photonic component and a landing pad at a first surface of the PIC, the active photonic component including a diode junction, a cathode, and an anode, at least one of the cathode and the anode being electrically connected to an electrical contact on the top surface of the PIC by the one or more patterned electrically conducting layers; and an electronic integrated circuit (EIC) stacked on the first surface of the PIC, the EIC including an analog/mixed signal (AMS) block including and inductor and at least one of a driver or a transimpedance amplifier, the driver or transimpedance amplifier being electrically connected to an electrical contact on a first surface of the EIC facing the first surface of the PIC, wherein the electrical contact on the first surface of the EIC is electrically connected to the electrical contact on the first surface of the PIC and the inductor in the AMS block is laterally aligned with an area of the PIC free of electrical conductors in the one or more electrically conducting layers.

B2. The system-in-package of paragraph B1, wherein the AMS block includes at least one phase locked loop (PLL) that includes the inductor.

B3. The system-in-package of paragraph B1, wherein the inductor includes a spiral shaped element.

B4. The system-in-package of paragraph B1, wherein the active photonic component is an electro-absorption modulator (EAM), and the AMS block includes a driver electrically connected to EAM.

B5. The system-in-package of paragraph B1, wherein the active photonic component is a photodetector, and the AMS block includes a TIA electrically connected to the photodetector.

B6. The system-in-package of paragraph B1, wherein the electrical contact on the first surface of the EIC is electrically connected to one of the electrical contacts on the top surface of the PIC by a copper pillar.

B7. The system-in-package of paragraph B1, wherein the area free of the electrical conductors has a first lateral dimension of 50 micrometers or more.

B8. The system-in-package of paragraph B7, wherein the area free of the electrical conductors has a second lateral dimension of 50 micrometers or more, the first and second lateral dimensions being orthogonal.

B9. The system-in-package of paragraph B1, wherein the AMS block includes multiple AMS components, the AMS components being selected from the group consisting of a driver and a transimpedance amplifier, each AMS component being electrically connected to a corresponding electrical contact on the first surface of the EIC.

B10. The system-in-package of paragraph B9, wherein the PIC includes multiple active photonic components each electrically connected to a corresponding one of the AMS component.

B11. The system-in-package of paragraph B1, wherein the diode junction includes germanium silicon.

B12. The system-in-package of paragraph B1, wherein the electrical contact on the top surface of the PIC is laterally offset from the anode and the cathode of the active photonic component.

B13. The system-in-package of paragraph B1, wherein the AMS block is electrically connected to a compute block.

B14. The system-in-package of paragraph B13, wherein the EIC includes the compute block.

B15. A method of forming a system-in-package, including: providing a photonic integrated circuit (PIC) including an active photonic component and one or more patterned electrically conducting layers between the active photonic component and a landing pad on a top surface of the PIC, the active photonic component including a diode junction, a cathode, and an anode, at least one of the cathode and the anode being electrically connected to an electrical contact on the top surface of the PIC by the one or more patterned electrically conducting layers; providing an electronic integrated circuit (EIC) including an analog/mixed signal (AMS) block including an inductor and at least one of a driver or a transimpedance amplifier, the driver or transimpedance amplifier being electrically connected to an electrical contact on a first surface of the EIC; and attaching the EIC to the PIC by stacking the EIC on the top surface of the PIC with the first surface of the EIC facing the top surface of the PIC, electrically connecting the electrical contact on the first surface of the EIC with the electrical contact on the top surface of the PIC and laterally aligning the inductor in the AMS block with an area of the PIC free of electrical conductors in the one or more electrically conducting layers.

B16. The method of paragraph B15, wherein the electrical contact on the first surface of the EIC is electrically connected to the top surface of the PIC with a copper pillar.

B17. The method of paragraph B15, further including filling a gap between the first surface of the EIC and the top surface of the PIC with a molding compound.

C1. A system-in-package including: a photonic integrated circuit (PIC) including an active photonic component and one or more patterned electrically conducting layers between the active photonic component and a landing pad and an electrically conducting shield at a first surface of the PIC, the active photonic component including a diode junction, a cathode, and an anode, at least one of the cathode and the anode being electrically connected to an electrical contact on the top surface of the PIC by the one or more patterned electrically conducting layers; and an electronic integrated circuit (EIC) stacked on the first surface of the PIC, the EIC including an analog/mixed signal (AMS) block including and inductor and at least one of a driver or a transimpedance amplifier, the driver or transimpedance amplifier being electrically connected to an electrical contact on a first surface of the EIC facing the first surface of the PIC, wherein the electrical contact on the first surface of the EIC is electrically connected to the electrical contact on the first surface of the PIC and the inductor in the AMS block is laterally aligned with the electrically conducting shield, the electrically conducting shield being electrically grounded via an electrical interconnect connecting the shield to an electrical contact at a second surface of the PIC opposite the first surface.

C2. The system-in-package of paragraph C1, wherein the AMS block includes at least one phase locked loop (PLL) that includes the inductor.

C3. The system-in-package of paragraph C1, wherein the inductor includes a spiral shaped element.

C4. The system-in-package of paragraph C1, wherein the PIC includes an outermost patterned electrically conducting layer nearest the first surface of the PIC, and the landing pad and shield are both provided in the outermost patterned electrically conducting layer.

C5. The system-in-package of paragraph C4, wherein the outermost patterned electrically conducting layer includes aluminum.

C6. The system-in-package of paragraph C4, wherein the outermost patterned electrically conducting layer supports an oxide layer that provides the first surface of the PIC.

C7. The system-in-package of paragraph C1, wherein the active photonic component is an electro-absorption modulator (EAM), and the AMS block includes a driver electrically connected to EAM.

C8. The system-in-package of paragraph C1, wherein the active photonic component is photodetector, and the AMS block includes a TIA electrically connected to the photodetector.

C9. The system-in-package of paragraph C1, wherein the electrical contact on the first surface of the EIC is electrically connected to one of the electrical contacts on the first surface of the PIC by a copper pillar.

C10. The system-in-package of paragraph C1, wherein the shield has a first lateral dimension of 50 micrometers or more.

C11. The system-in-package of paragraph C10, wherein the shield has a second lateral dimension of 50 micrometers or more, the first and second lateral dimensions being orthogonal.

C12. The system-in-package of paragraph C1, wherein the AMS block includes multiple AMS components, the AMS components being selected from the group consisting of a driver and a transimpedance amplifier, each AMS component being electrically connected to a corresponding electrical contact on the first surface of the EIC.

C13. The system-in-package of paragraph C12, wherein the PIC includes multiple active photonic components each electrically connected to a corresponding one of the AMS components.

C14. The system-in-package of paragraph C1, wherein the diode junction includes germanium silicon.

C15. The system-in-package of paragraph C1, wherein the electrical contact on the first surface of the PIC is laterally offset from the anode and the cathode of the active photonic component.

C16. The system-in-package of paragraph C1, wherein the AMS block is electrically connected to a compute block.

C17. The system-in-package of paragraph C16, wherein the EIC includes the compute block.

D1. A system-in-package including: a photonic integrated circuit (PIC) including a substrate supporting an electro-absorption modulator (EAM) and one or more patterned electrically conducting layers between the EAM and a first surface of the PIC, the EAM including a diode junction and a pair of electrodes on opposing sides of the diode junction, a first electrode of the pair of electrodes being electrically connected to an electrical contact at the first surface of the PIC by the one or more patterned electrically conducting layers, and a second electrode of the pair of electrodes being electrically connected to an electrical contact at a second surface of the PIC by one or more vias extending through the substrate, the first surface of the PIC being opposite the second surface of the PIC; and an electronic integrated circuit (EIC) stacked on the first surface of the PIC, the EIC including a driver electrically connected to an electrical contact at a first surface of the EIC facing the first surface of the PIC, wherein the electrical contact on the first surface of the EIC is electrically connected to the electrical contact on the first surface of the PIC.

D2. The system of paragraph D1, wherein the EIC is configured so that during operation the driver drives the modulator by applying an alternating current (AC) electrical signal to the first electrode during operation to encode an optical signal in a waveguide in the PIC with data.

D3. The system of paragraph D2, wherein the first electrode is a cathode.

D4. The system of paragraph D3, wherein the EIC is configured so that the time-varying electrical signal includes a positive voltage.

D5. The system of paragraph D2, wherein the system is configured to apply a direct current (DC) voltage signal to the second electrode during operation.

D6. The system of paragraph D1, wherein the second electrode is grounded.

D7. The system of paragraph D1, wherein the first electrode is a cathode, and the second electrode is an anode.

D8. The system of paragraph D1, wherein the electrical contact on the first surface of the EIC is electrically connected to one of the electrical contacts on the top surface of the PIC by a copper pillar.

D9. The system of paragraph D1, wherein the PIC includes multiple EAMs, each electrically connected to a corresponding driver in the EIC via a respective copper post.

D10. The system of paragraph D1, wherein the diode junction includes germanium silicon.

D11. The system of paragraph D1, wherein the electrical contact on the top surface of the PIC is laterally offset from the first electrode of the EAM.

D12. The system of paragraph D1, wherein the driver is a component of an AMS block that is electrically connected to a compute block.

D13. The system of paragraph D12, wherein the EIC includes the compute block.

D14. The system of paragraph D1, wherein the driver is a component in an AMS block that is electrically connected to a memory device.

D15. The system of paragraph D14, wherein the memory device is a high bandwidth memory (HBM) device.

D16. The system-in-package of paragraph D15, wherein the HBM device is electrically connected to the AMS block via electrical connections in the PIC.

D17. A method of forming a system-in-package, including: providing a photonic integrated circuit (PIC) including an active photonic component and one or more patterned electrically conducting layers between the active photonic component and a first surface of the PIC, the active photonic component including a diode junction and a pair of electrodes on opposing sides of the diode junction, a first electrode of the pair of electrodes being electrically connected to an electrical contact at the first surface of the PIC by the one or more patterned electrically conducting layers, and a second electrode of the pair of electrodes being electrically connected to an electrical contact at a bottom surface of the PIC by one or more vias extending through the substrate; providing an electronic integrated circuit (EIC) including a driver electrically connected to an electrical contact at a first surface of the EIC facing the first surface of the PIC; and attaching the EIC to the PIC by stacking the EIC on the first surface of the PIC with the first surface of the EIC facing the first surface of the PIC, electrically connecting the electrical contact at the first surface of the EIC with the electrical contact at the first surface of the PIC.

D18. The method of paragraph D17, wherein the electrical contact on the first surface of the EIC is electrically connected to the electrical contact at the first surface of the PIC with a copper pillar.

D19. The method of paragraph D17, further including filling a gap between the first surface of the EIC and the first surface of the PIC with a molding compound.

D20. The method of paragraph D17, further including electrically connecting the electrical contact at the second surface of the PIC to ground.

D21. The method of paragraph D17, further including electrically connecting the electrical contact at the second surface of the PIC to a variable direct current (DC) voltage source.

A number of examples are disclosed. Other examples are in the following claims.

What is claimed is:

1. A system-in-package comprising:
   a photonic integrated circuit (PIC) comprising an electro-absorption modulator (EAM) electrically connected to a first landing pad at a surface of the PIC;
   an electronic integrated circuit (EIC) stacked on the surface of the PIC, the EIC comprising an electrical component electrically connected to a second landing pad at a surface of the EIC facing the surface of the PIC; and
   a copper pillar physically connecting the first landing pad to the second landing pad,
   wherein the first landing pad, the copper pillar, and the second landing pad provide at least a portion of a first electrical interconnect between the EAM and the electrical component, and when viewed from the EIC towards the PIC, the EAM of the PIC is offset from the first landing pad,
   wherein the EAM comprises a diode junction, a cathode, and an anode,
   wherein the electrical component is a driver of the EAM, and
   wherein, when viewed from the EIC towards the PIC, a center of the EAM is offset from a nearest edge of the first landing pad by about a distance in a range from 1 μm to 10 μm.

2. The system-in-package of claim 1, wherein a parasitic capacitance between the first landing pad and the EAM is less than a pre-determined threshold level of tolerance, and wherein the pre-determined threshold level of tolerance is where the parasitic capacitance causes the EAM to lose modulation fidelity.

3. The system-in-package of claim 1, wherein the copper pillar is electrically connected to the cathode of the EAM.

4. The system-in-package of claim 1, further comprising a substrate supporting the PIC, and wherein the anode of the EAM is electrically connected to a bias trace routed to the substrate.

5. The system-in-package of claim 1, wherein the distance is in a range from 5 μm and 8 μm.

6. The system-in-package of claim 1, wherein the EAM is about 100 μm or less in length from an input optical port to an output optical port.

7. The system-in-package of claim 1, wherein the copper pillar has a lateral dimension of 30 μm or less.

8. The system-in-package of claim 7, wherein the first landing pad is shaped as a polygon or a circle.

9. The system-in-package of claim 7, wherein the first landing pad has a maximum lateral dimension of 50 μm or less.

10. The system-in-package of claim 1, wherein the copper pillar contacts the first landing pad at a center of the first landing pad.

11. The system-in-package of claim 1, wherein the copper pillar contacts the first landing pad away from a center of the first landing pad.

12. The system-in-package of claim 1, wherein, the driver and the modulator are spaced apart by about 2 mm or less.

13. The system-in-package of claim 1, wherein the PIC further comprises a photodiode and the EIC further comprises a trans-impedance amplifier electrically connected to the photodiode via a second electrical interconnect comprising a second copper pillar between the PIC and the EIC, the modulator and the photodiode being components of a bidirectional photonic link in the PIC.

14. The system-in-package of claim 13, wherein the bidirectional photonic link comprises a first waveguide connecting the modulator to a fiber array unit and a second waveguide connecting the photodiode to the fiber array unit.

15. The system-in-package of claim 13, wherein the first and second electrical interconnects each have a length of 100 μm or less.

16. A method for providing a system-in-package comprising a photonic integrated circuit (PIC) and an electronic integrated circuit (EIC), the PIC comprising an electro-absorption modulator (EAM) electrically connected to a first landing pad at a surface of the PIC, the EIC comprising an electrical component electrically connected to a second landing pad at a surface of the EIC, the method comprising:
   providing a copper pillar in the EIC contacting the second landing pad, the copper pillar protruding from the EIC; and attaching a protruding portion of the copper pillar to the first landing pad to provide an electrical interconnect between the EAM and the electrical component while stacking the EIC on the PIC such that, when viewed from the EIC towards the PIC, the EAM of the PIC is offset from the first landing pad, and wherein, when viewed from the EIC towards the PIC, a center of the EAM is offset from a nearest edge of the first landing pad by a distance large enough to limit a parasitic capacitance between the first landing pad and the EAM to be less than a pre-determined threshold level of tolerance, and wherein the pre-determined threshold level of tolerance is where the parasitic capacitance causes the EAM to lose modulation fidelity.

17. The method of claim 16, wherein providing the copper pillar in the EIC comprises forming an opening in a layer of an oxide material coating the landing pad and forming the copper pillar to protrude from the layer of the oxide material.

18. The method of claim 17, wherein attaching the protruding portion of the copper pillar to the first landing pad comprises forming an opening in a layer of an oxide material on the PIC to expose the first landing pad and contacting the copper pillar to the first landing pad.

19. The method of claim 16, wherein the first and/or second landing pads comprises aluminum.

20. The method of claim 19, wherein the first and/or second landing pads are plated with nickel and/or gold.

21. A system-in-package comprising:
a photonic integrated circuit (PIC) comprising an electro-absorption modulator (EAM) electrically connected to a first landing pad at a surface of the PIC;
an electronic integrated circuit (EIC) stacked on the surface of the PIC, the EIC comprising an electrical component electrically connected to a second landing pad at a surface of the EIC facing the surface of the PIC; and
a copper pillar physically connecting the first landing pad to the second landing pad,
wherein the first landing pad, the copper pillar, and the second landing pad provide at least a portion of an electrical interconnect between the EAM and the electrical component, and when viewed from the EIC towards the PIC, a center of the EAM of the PIC is offset from a nearest edge of the first landing pad by a distance large enough to limit a parasitic capacitance between the first landing pad and the EAM to less than a pre-determined threshold level of tolerance, and wherein the pre-determined threshold level of tolerance is where the parasitic capacitance causes the EAM to lose modulation fidelity.

22. The system-in-package of claim 21, wherein the EAM comprises a diode junction, a cathode, and an anode, and wherein the copper pillar is electrically connected to the cathode of the EAM.

23. The system-in-package of claim 22, wherein the copper pillar contacts the first landing pad at a center of the first landing pad.

24. The system-in-package of claim 22, wherein the copper pillar contacts the first landing pad away from a center of the first landing pad.

25. The system-in-package of claim 22, wherein, the driver and the modulator are spaced apart by about 2 mm or less.

26. The system-in-package of claim 22, wherein the PIC further comprises a photodiode and the EIC further comprises a trans-impedance amplifier electrically connected to the photodiode via a second electrical interconnect comprising a second copper pillar between the PIC and the EIC, the modulator and the photodiode being components of a bidirectional photonic link in the PIC.

27. The system-in-package of claim 26, wherein the bidirectional photonic link comprises a first waveguide connecting the modulator to a fiber array unit and a second waveguide connecting the photodiode to the fiber array unit.

28. The system-in-package of claim 26, wherein the first and second electrical interconnects each have a length of 100 mm or less.

29. The system-in-package of claim 22, further comprising a substrate supporting the PIC, and wherein the anode of the EAM is electrically connected to a bias trace routed to the substrate.

30. The system-in-package of claim 22, wherein the distance is in a range from 5 μm and 8 μm.

31. The system-in-package of claim 22, wherein the EAM is about 100 μm or less in length from an input optical port to an output optical port.

32. The system-in-package of claim 22, wherein the copper pillar has a lateral dimension of 30 μm or less.

33. The system-in-package of claim 32, wherein the first landing pad is shaped as a polygon or a circle.

34. The system-in-package of claim 32, wherein the first landing pad has a maximum lateral dimension of 50 μm or less.

* * * * *